(12) United States Patent
Sasaki et al.

(10) Patent No.: US 7,859,258 B2
(45) Date of Patent: Dec. 28, 2010

(54) MAGNETIC SENSOR AND MAGNETIC SENSOR MODULE

(75) Inventors: Hiromitsu Sasaki, Niicata-ken (JP);
Hirofumi Fukui, Niigata-ken (JP);
Takashi Hatanai, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/820,764

(22) Filed: Jun. 22, 2010

(65) Prior Publication Data
US 2010/0259257 A1    Oct. 14, 2010

Related U.S. Application Data

(63) Continuation of application No. PCT/JP2008/072920, filed on Dec. 17, 2008.

(30) Foreign Application Priority Data

Dec. 28, 2007 (JP) .............................. 2007-339671
Jun. 11, 2008 (JP) .............................. 2008-152713

(51) Int. Cl.
*G01R 33/09* (2006.01)
*H01L 43/08* (2006.01)

(52) U.S. Cl. ................................. 324/252; 324/207.21
(58) Field of Classification Search ............ 324/207.21, 324/252
See application file for complete search history.

(56) References Cited

FOREIGN PATENT DOCUMENTS

| JP | 56-034131 | 4/1981 |
|----|-----------|--------|
| JP | 58-197892 | 11/1983 |
| JP | 59-195889 | 11/1984 |
| JP | 2005-183614 | 7/2005 |

OTHER PUBLICATIONS

International Search Report issued in corresponding PCT Application No. PCT/JP2008/072920; mailed Mar. 17, 2009.

*Primary Examiner*—Reena Aurora
(74) *Attorney, Agent, or Firm*—Brinks Hofer Gilson & Lione

(57) ABSTRACT

Magnetoresistive effect elements are provided with an element unit having an elongated shape in which an element length L1 is formed to be longer than an element width W1. The element unit has a fixed magnetic layer and a free magnetic layer laminated via a non-magnetic layer on the fixed magnetic layer. A magnetism direction of the fixed magnetic layer faces an element width direction (Y direction) of a sensitivity axis direction. First soft magnetic bodies formed to have a width size W2 and a length size L2 are arranged in a non-contact manner on both lateral sides of the magnetoresistive effect element. The length size L2 is longer than the element length L1, and the first soft magnetic body has an extension part extending in an element length direction from both sides in the element length direction of the element unit.

19 Claims, 16 Drawing Sheets

MAGNETIC SENSOR AND MAGNETIC SENSOR MODULE

CLAIM OF PRIORITY

This application is a Continuation of International Application No. PCT/JP2008/072920 filed on Dec. 17, 2008, which claims benefit of the Japanese Patent Application No. 2007-339671 filed on Dec. 28, 2007 and the Japanese Patent Application No. 2008-152713 filed on Jun. 11, 2008, which are hereby incorporated by reference.

BACKGROUND OF THE INVENTION

1. Field of the Invention

The present invention relates, for example, to a magnetic sensor using a magnetoresistive effect element which is used as a geomagnetic sensor.

2. Description of the Related Art

A magnetic sensor using a magnetoresistive effect element can be used, for example, as a geomagnetic sensor fitted into a mobile device such as a mobile phone for detecting earth magnetism. In the magnetoresistive effect element, an electric resistance value fluctuates with respect to a magnetic field intensity from a sensitivity axis.

In the geomagnetic sensor, it is necessary to detect the magnetism through resolution into two axes or three axes, and therefore it is necessary to adopt a configuration in which magnetic sensors for detecting the magnetic field intensities of the respective axes do not have intensities to the other axes. Also, in order to accurately detect the magnetic field intensity, a sensor having an output linear to the magnetic field intensity is demanded.

On the other hand, a member generating a magnetic field more intense earth magnetism such as, for example, a speaker is mounted in the mobile device in many cases, and also the magnetic field in the mobile device often fluctuates due to opening or closing of the device, insertion or removal of a memory card, or the like. For that reason, for example, even when a leaked magnetic field at about several Oe generated within the mobile device is applied from various directions, it is necessary to carry out a control so that the earth magnetism can be accurately measured.

Japanese Unexamined Patent Application Publication No. 2005-183614 described below discloses a magnetic sensor having a meander shape in which a plurality of band-shaped magnetoresistive effect films are arranged in parallel to one another, and ends of the respective magnetoresistive effect elements are connected with permanent magnetic films.

However, Japanese Unexamined Patent Application Publication No. 2005-183614 does not show recognition on the problem in the related art with respect to the above-mentioned geomagnetic sensor or disclose means for solving the problem.

SUMMARY OF THE INVENTION

In view of the above, the present invention has been made to solve the problem in the related art and provides a magnetic sensor and a magnetic sensor module in which, in particular, the magnetic shield effect with respect to the direction perpendicular to the sensitivity axis can be improved, and furthermore, the sensitivity as the magnetic sensor with respect to the external magnetic field from the sensitivity axis direction can be maintained.

According to an aspect of the present invention, there is provided a magnetic sensor including: a magnetoresistive effect element including an element unit whose element length L1 is formed longer than an element width W1, the element unit including a fixed magnetic layer whose magnetism direction is fixed and a free magnetic layer whose magnetism direction fluctuates upon reception of an external magnetic field, the free magnetic layer being laminated on the fixed magnetic layer via a non-magnetic layer, and the fixed magnetism direction of the fixed magnetic layer facing an element width direction which is a sensitivity axis direction; and a first soft magnetic body arranged in a non-contact manner with the magnetoresistive effect element, the first soft magnetic body being formed to have a width size in a same direction as the element width W1 set as W2 and a length size in a same direction as the element length L1 set as L2, the length size L2 of the first soft magnetic body being longer than the element length L1, and the first soft magnetic body including an extension part extending from both sides of the element length direction of the element unit in the element length direction.

With the above-mentioned configuration, the magnetic shield effect with respect to the direction perpendicular to the sensitivity axis can be improved. Therefore, it is possible to set the magnetic field from the direction perpendicular to the sensitivity axis to be lower than 100% of the external magnetic field at the element position. Also, it is possible to avoid the magnetic saturation with respect to the leak magnetic field from the sensitivity axis direction, and the sensitivity as the magnetic sensor can be maintained.

According to an aspect of the present invention, it is possible to present both a mode in which the width size W2 of the first soft magnetic body may be smaller than the element width W1 of the magnetoresistive effect element and a mode in which the width size W2 of the first soft magnetic body may be equal to or larger than the element width W1.

Also, according to an aspect of the present invention, it is possible to present a mode in which the first soft magnetic bodies may be arranged on both sides in the element width direction of the element unit. Alternatively, it is possible to present a mode in which the first soft magnetic bodies may be arranged in a thickness direction of the element unit.

According to an aspect of the present invention, preferably, a plurality of the element units are arranged with a gap in the element width direction, and ends of the element units are connected to form a meander shape, and the first soft magnetic body is preferably arranged at a position immediately above the element unit, a position immediately below the element unit, or at least one of positions on both sides of the element unit for each of the element units. With the meander shape, the element resistance can be set large, and the consumed power can be reduced. As the first soft magnetic body is arranged for each of the element units, the magnetic shield effect can be appropriately improved in the direction perpendicular to the sensitivity axis, and also, the appropriate sensitivity can be maintained in the sensitivity axis direction.

A length size of the extending unit of the first soft magnetic body/a distance between the respective first soft magnetic bodies is preferably equal to or larger than 3.

A gap between the respective first soft magnetic bodies is preferably larger than the width size W2 of the first soft magnetic body.

According to an aspect of the present invention, the first soft magnetic body is preferably further arranged at least one each on an outer side of both lateral surfaces of the element units located on both sides in the element width direction, so that the magnetic shield effect can be more appropriately increased.

Also, according to an aspect of the present invention, the magnetic sensor preferably further includes: the magnetoresistive effect element and a fixed resistance element connected in series with the magnetoresistive effect element via an output taking out unit, the fixed resistance element including an element unit having an elongated shape in which an element length is formed to be longer than an element width, the element unit constituting the fixed magnetic layer including the fixed magnetic layer and the free magnetic layer laminated on the fixed magnetic layer via the non-magnetic layer; an extension part having a gap with respect to the element unit constituting the fixed resistance element and extending in the element width direction from both sides of the element width of the element unit in which a width size W3 in a same direction as the element width is larger than the element width; an extension part extending in the element length direction from both sides in the element length direction of the element unit in which a length size L3 in a same direction as the element length is larger than the element length; and a second soft magnetic body arranged in a laminated manner in which the length size L3 is larger than the width size W3.

Also, a plurality of the element units constituting the fixed resistance element are preferably arranged with a gap in the element width direction, and the ends of the respective element units are connected to form a meander shape, and the second soft magnetic body is preferably individually arranged with respect to the respective element units constituting the fixed resistance element. Also, the second soft magnetic bodies are preferably further arranged on an outer side of both lateral surfaces of the element units located on both sides in the element width direction.

With the above-mentioned configuration, temperature coefficients of resistance (TCR) of the fixed resistance element and the magnetoresistive effect element can be equalized as compared with the related art. Also, by arranging the second soft magnetic body above the element unit constituting the fixed resistance element, the external magnetic field flowing into the element unit can be appropriately shielded, and realization of the fixed resistance can be carried out. Also, as it is not necessary to precisely match the resistance values, for example, the fixed resistance element can be manufactured more easily as compared with the related art.

Also, according to an aspect of the present invention, the element unit constituting the magnetoresistive effect element and the element unit constituting the fixed resistance element are preferably formed in a same film structure and in a same creation process.

Also, according to an aspect of the present invention, the first soft magnetic body and the second soft magnetic body are preferably formed in a same film structure and in a same creation process.

According to an aspect of the present invention, a linear region of a resistance change in the magnetoresistive effect element is preferably larger than an integration of a disturbance magnetic field flowing from the element width direction and a sensed magnetic field.

Also, an anisotropy magnetic field Hk in the magnetoresistive effect element is preferably equal to or larger than 20 Oe.

According to an aspect of the present invention, the width size W2 of the first soft magnetic body is preferably regulated so that a gain of a magnetic field intensity affecting the element unit is equal to or larger than 50% and equal to or smaller than 200% when the external magnetic field flows in from the element width direction. Alternatively, according to an aspect of the present invention, the width size W2 of the first soft magnetic body is preferably regulated so that a gain of a resistance change rate per unit magnetic field of the magnetoresistive effect element is equal to or larger than 50% and equal to or smaller than 200% when the external magnetic field flows in from the element width direction. It is possible to widen the linear region (sensitivity region) where fluctuates the resistance change rate (MR ratio) per unit magnetic field of the magnetoresistive effect element with respect to the intensity of the magnetic field from the sensitivity axis direction.

A magnetic sensor module according to the aspect of the present invention includes a plurality of the magnetic sensors according to one of the above-mentioned aspects, in which the respective magnetoresistive effect elements are arranged so that the sensitivity axes of at least one set of the magnetoresistive effect elements of the plurality of the magnetic sensors are perpendicular to each other. For example, the magnetic sensor module according to the aspect of the present invention can be used as the geomagnetic sensor.

With the magnetic sensor according to the aspect of the present invention, it is possible to improve the magnetic shield effect with respect to the direction perpendicular to the sensitivity axis. Also, it is possible to avoid the magnetic saturation with respect to the leak magnetic field from the sensitivity axis direction, and the sensitivity as the magnetic sensor can be maintained.

DESCRIPTION OF THE PREFERRED EMBODIMENTS

Figure 1A:
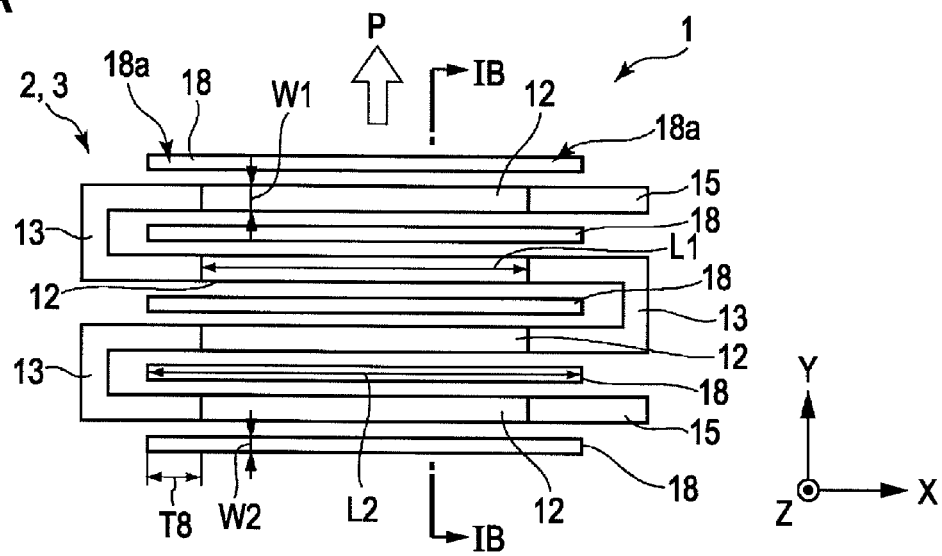
FIGS. 1A to 1C show a part of a magnetoresistive effect element, in particular, of a magnetic sensor according to a first embodiment of the present invention (FIG. 1A is a partial plan view, and FIG. 1B is a partial cross-section view as seen from an arrow direction while cutting in a height direction (Z direction in the drawing) along the IB-IB line of FIG. 1A)
Figure 1B:
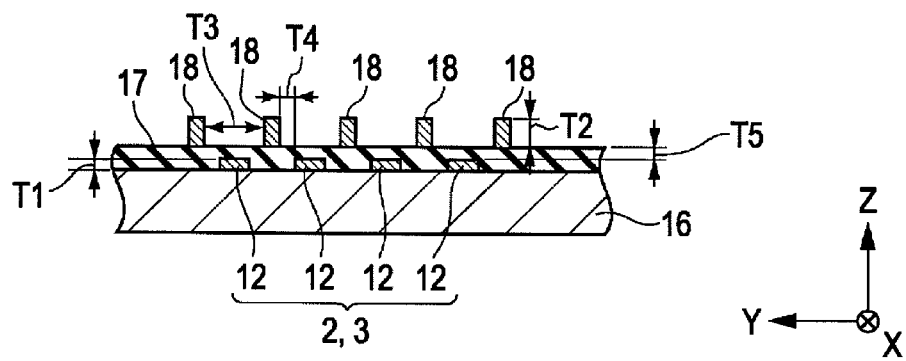
Figure 1C:
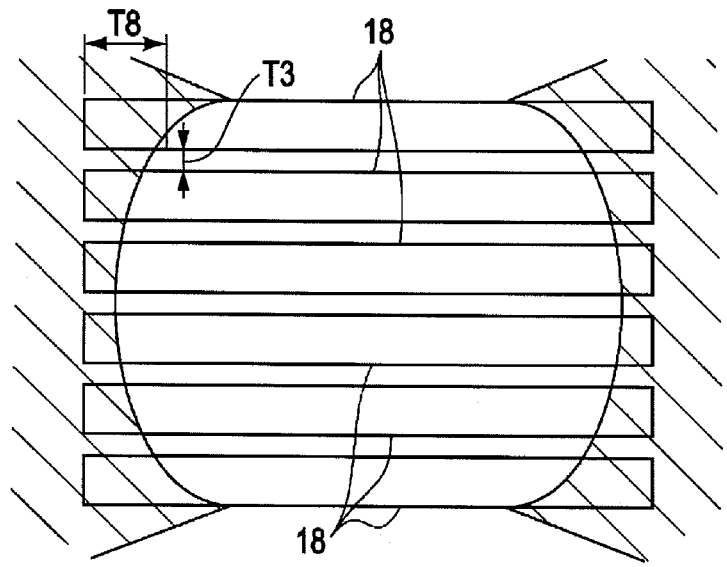
Figure 2A:
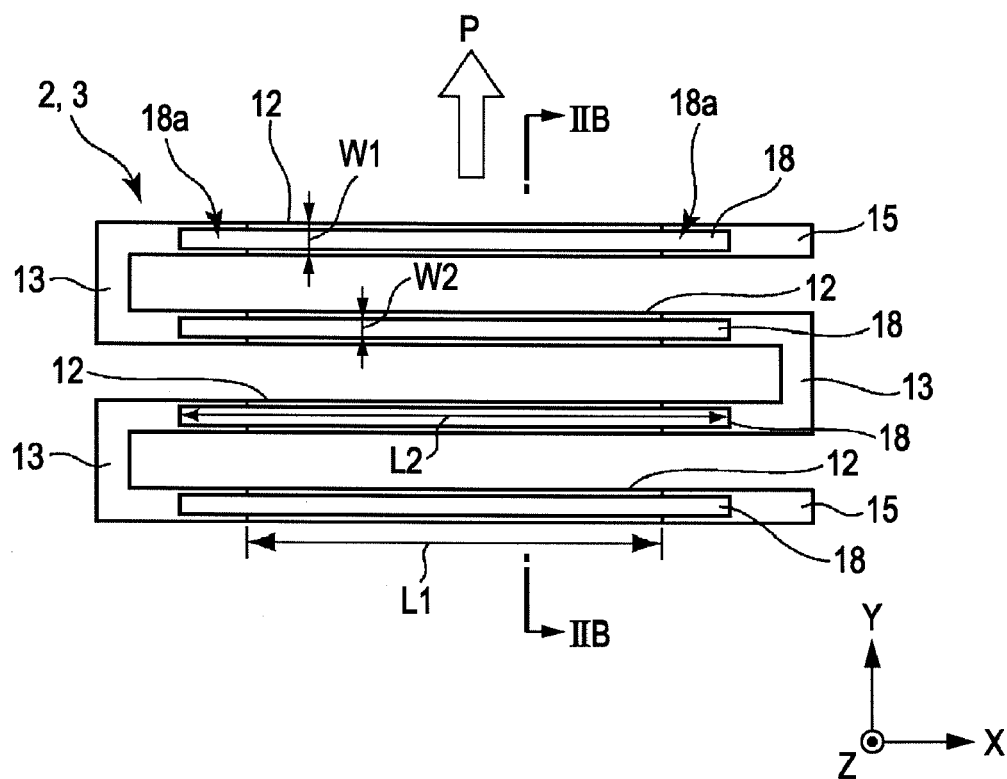
FIGS. 2A and 2B show a part of a magnetoresistive effect element, in particular, of a magnetic sensor according to a second embodiment of the present invention (FIG. 2A is a partial plan view, and FIG. 2B is a partial cross-section view as seen from an arrow direction while cutting in a height direction (Z direction in the drawing) along the IIB-IIB line of FIG. 2A)
Figure 2B:
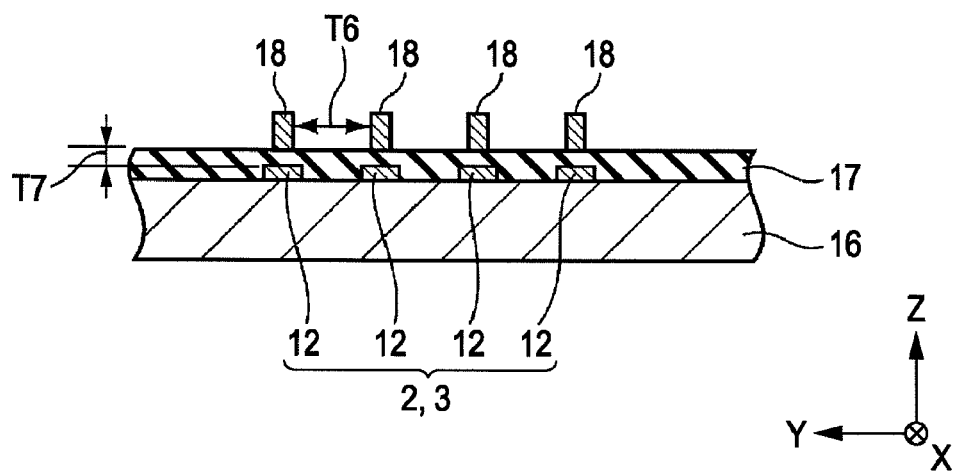
Figure 3A:
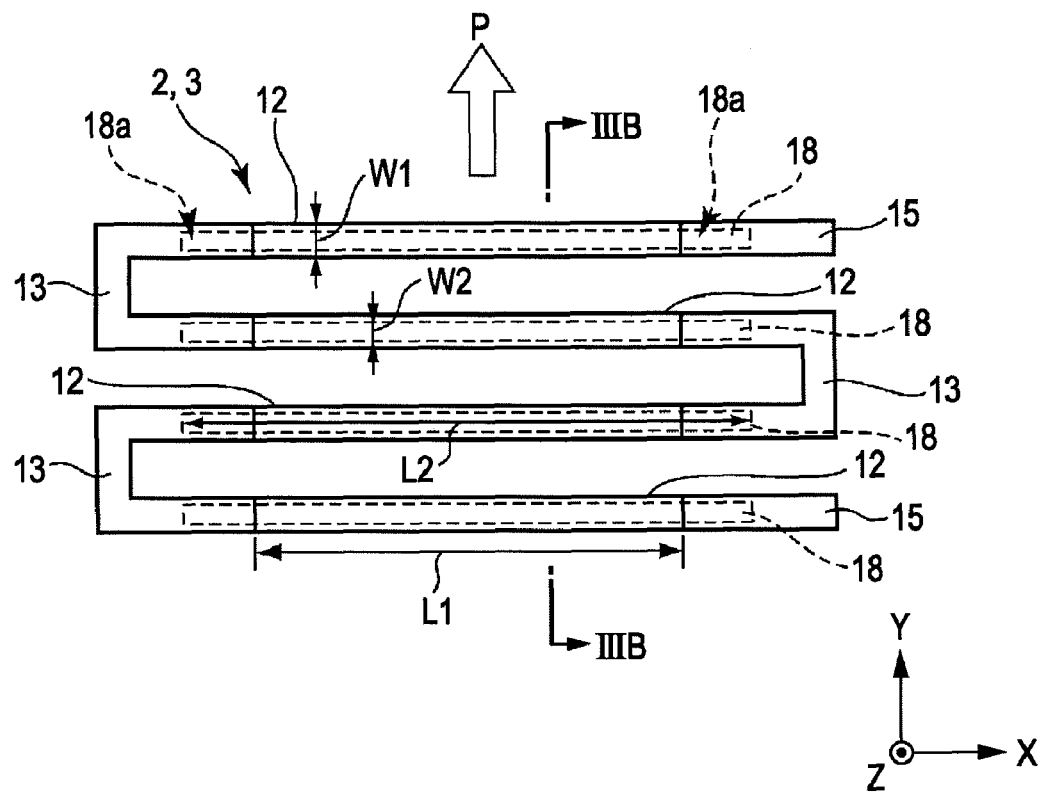
FIGS. 3A and 3B show a part of a magnetoresistive effect element, in particular, of a magnetic sensor according to a third embodiment of the present invention (FIG. 3A is a partial plan view, and FIG. 3B is a partial cross-section view as seen from an arrow direction while cutting in a height direction (Z direction in the drawing) along the IIIB-IIIB line of FIG. 3A)
Figure 3B:
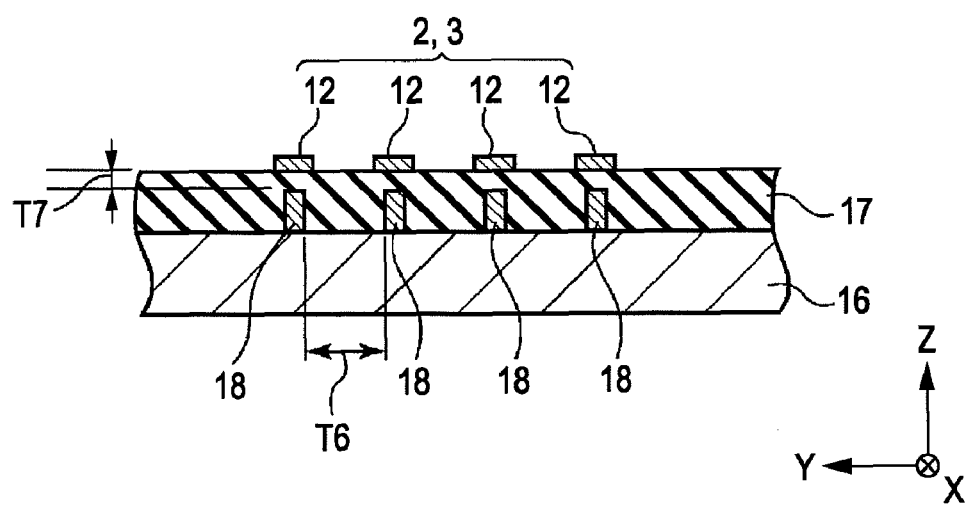
Figure 4:
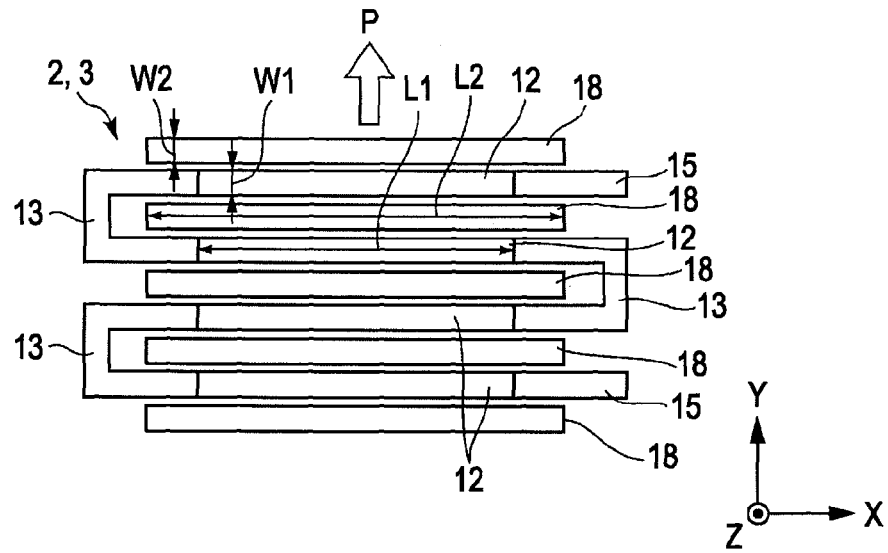
FIG. 4 is a partial plan view showing a part of a magnetoresistive effect element, in particular, of a magnetic sensor according to a fourth embodiment of the present invention.
Figure 5A:
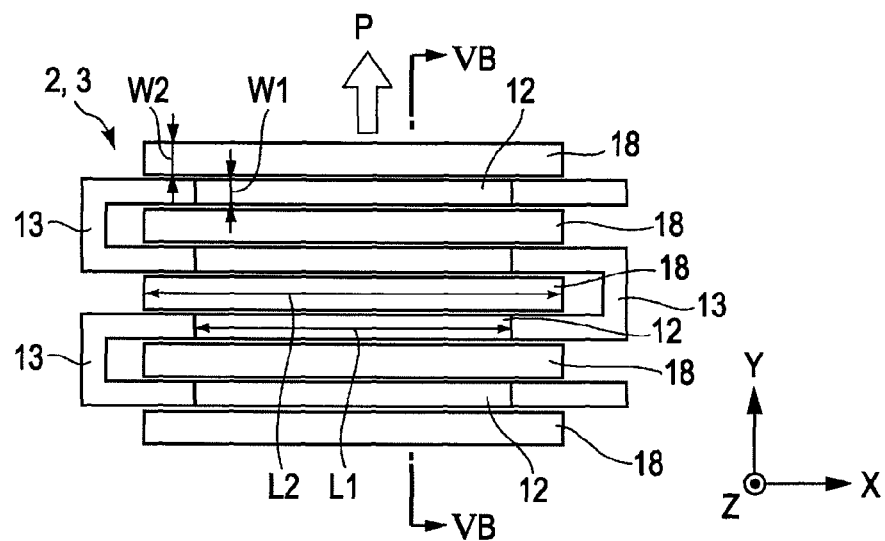
FIGS. 5A and 5B show a part of a magnetoresistive effect element, in particular, of a magnetic sensor according to a fifth embodiment of the present invention (FIG. 5A is a partial plan view, and FIG. 5B is a partial cross-section view as seen from an arrow direction while cutting in a height direction (Z direction in the drawing) along the VB-VB line of FIG. 5A)
Figure 5B:
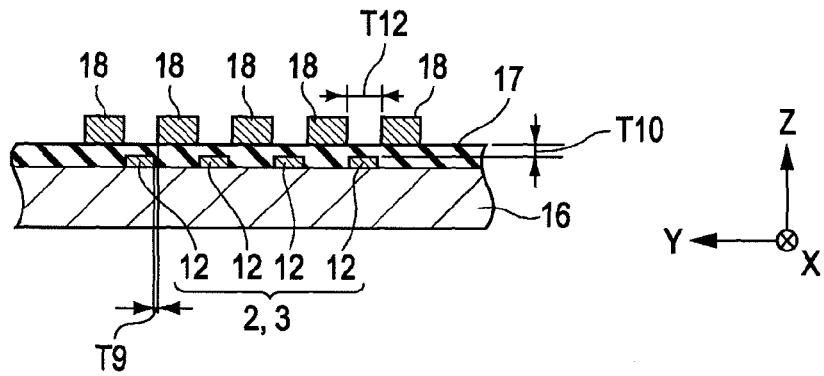
Figure 6A:
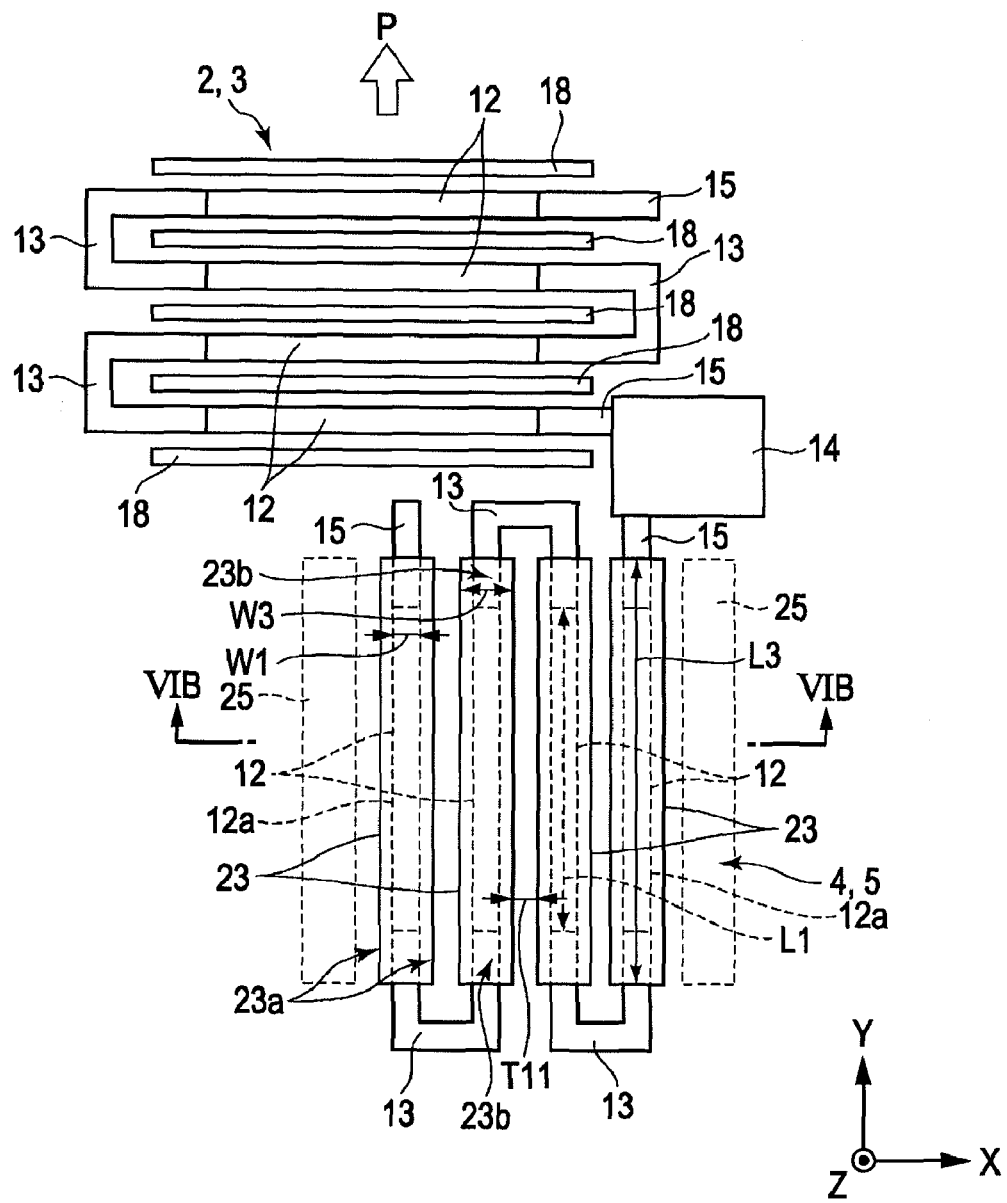
FIG. 6A is a partial plan view showing the magnetic sensor provided with the magnetoresistive effect element shown in FIGS. 1A to 1C and a fixed resistance element.
Figure 6B:
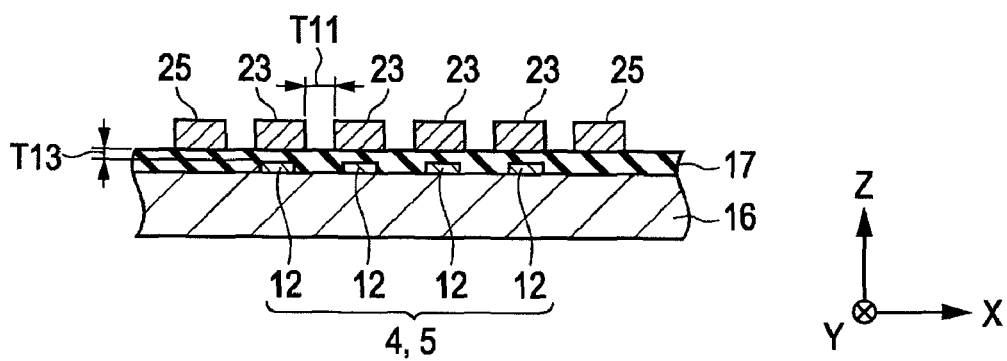
FIG. 6B is a partial cross-section view as seen from an arrow direction while cutting in a height direction (Z direction in the drawing) along the VIB-VIB line of FIG. 6A.
Figure 7A:
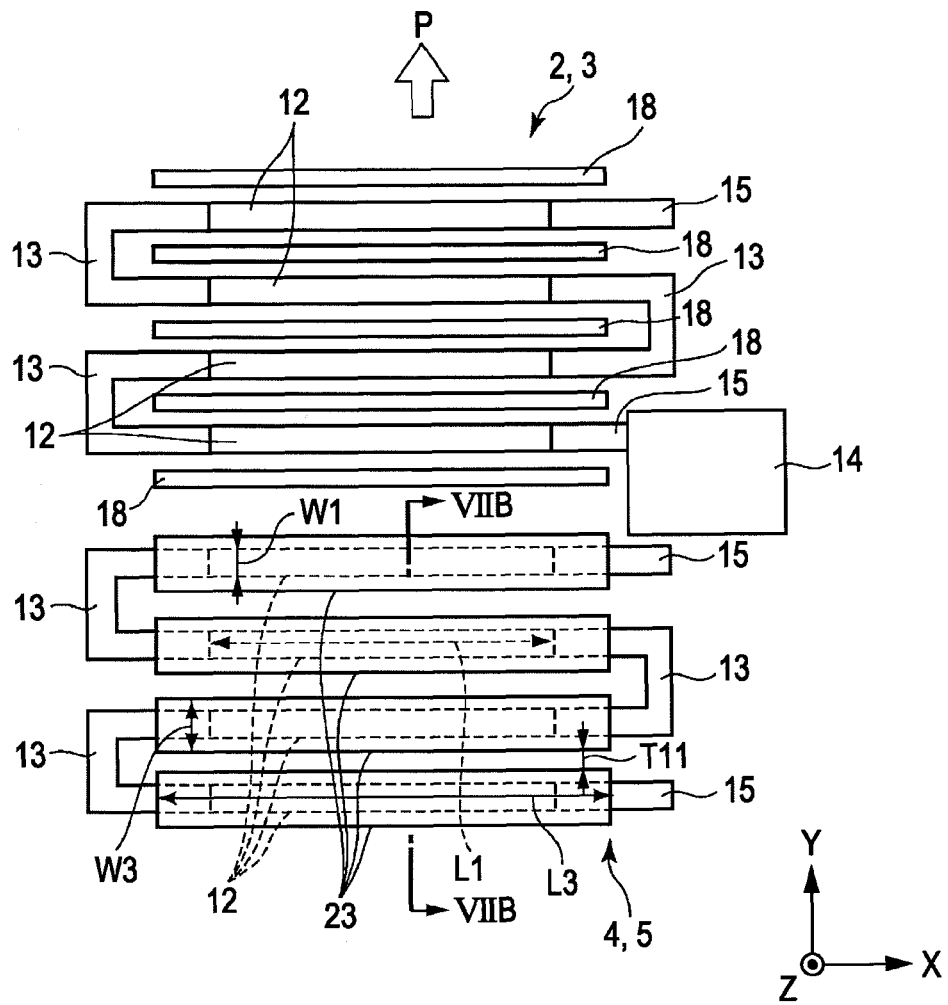
FIG. 7A is a partial plan view showing the magnetic sensor provided with the magnetoresistive effect element having a different configuration from FIGS. 6A and 6B and a fixed magnetic layer.
Figure 7B:
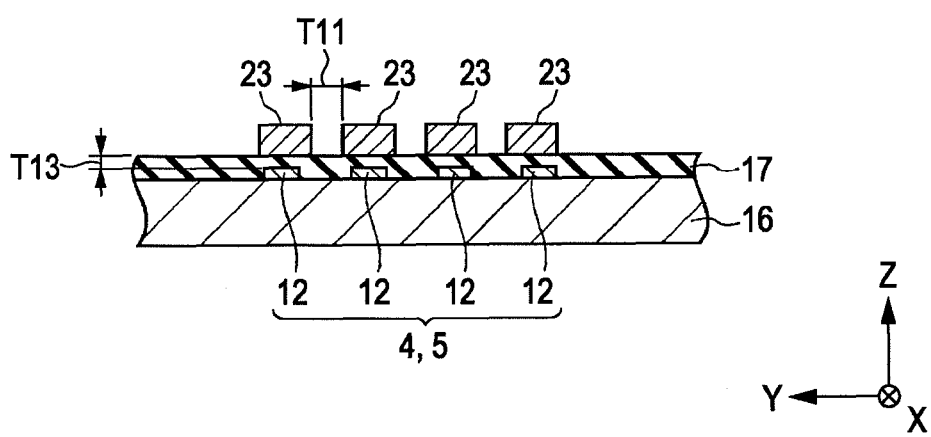
FIG. 7B is a partial cross-section view as seen from an arrow direction while cutting in a height direction (Z direction in the drawing) along the VIIB-VIIB line of FIG. 7A.
Figure 8:
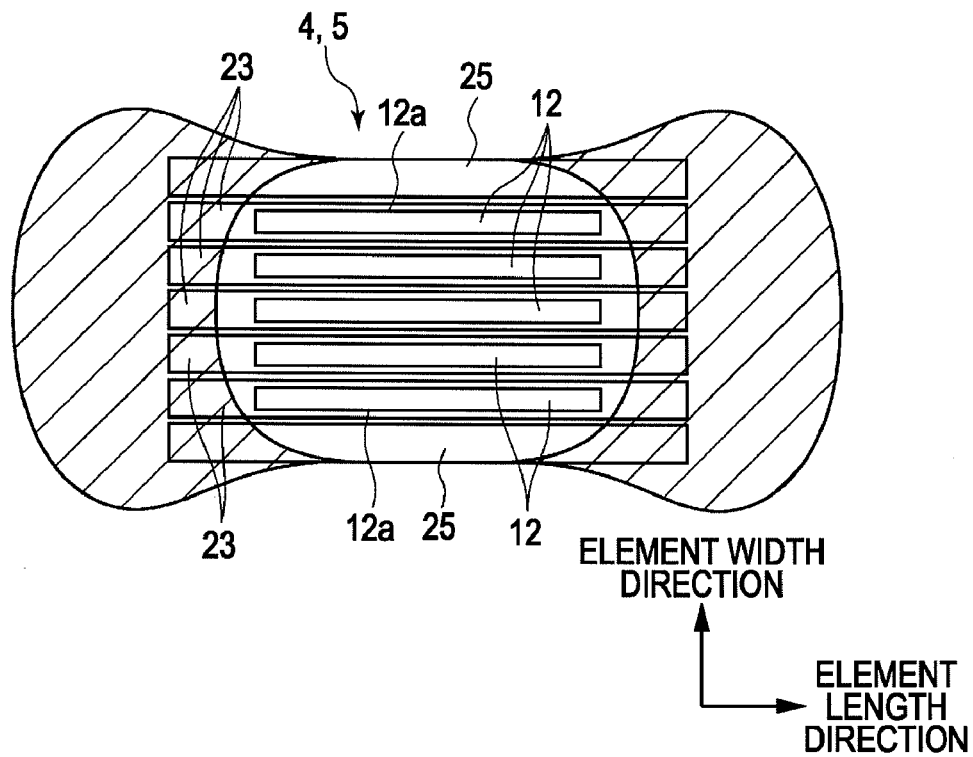
FIG. 8 is a partial plan view showing a configuration of the fixed resistance element according to a preferred embodiment of the present invention and an image diagram showing a simulation result of a magnetic field.
Figure 9:
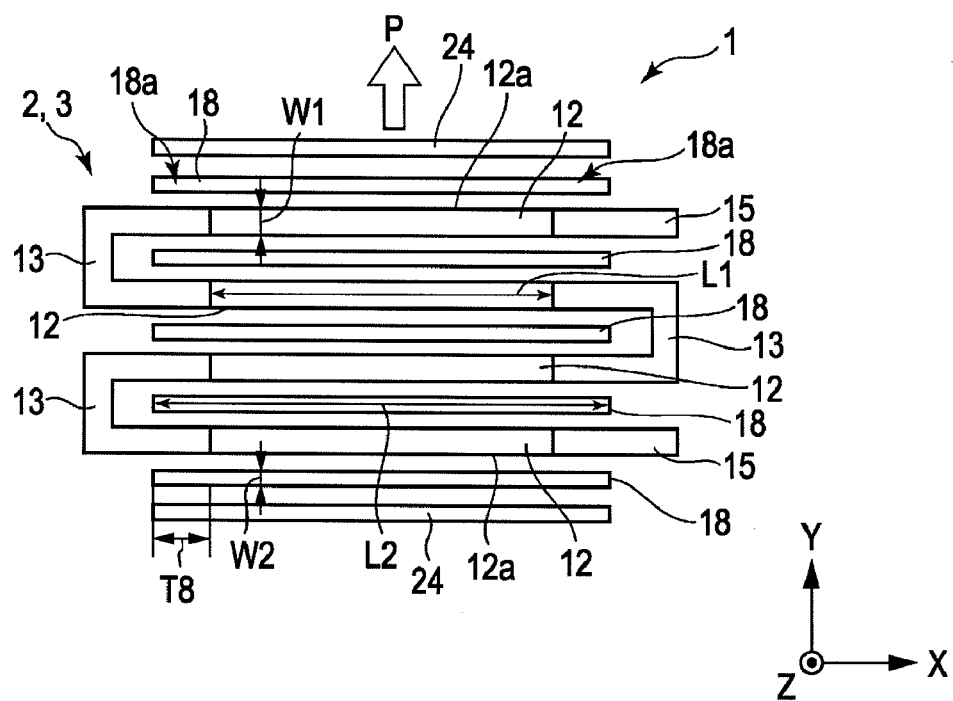
FIG. 9 is a partial plan view showing a part of a magnetoresistive effect element, in particular, of a magnetic sensor according to a sixth embodiment of the present invention.
Figure 10:
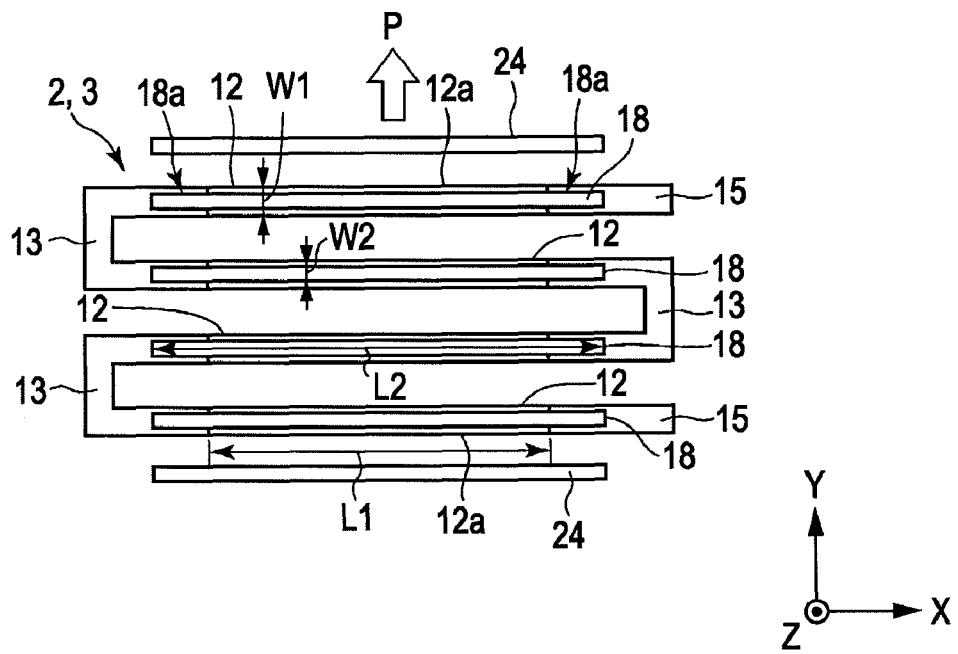
FIG. 10 is a partial plan view showing a part of a magnetoresistive effect element, in particular, of a magnetic sensor according to a seventh embodiment of the present invention.
Figure 11:
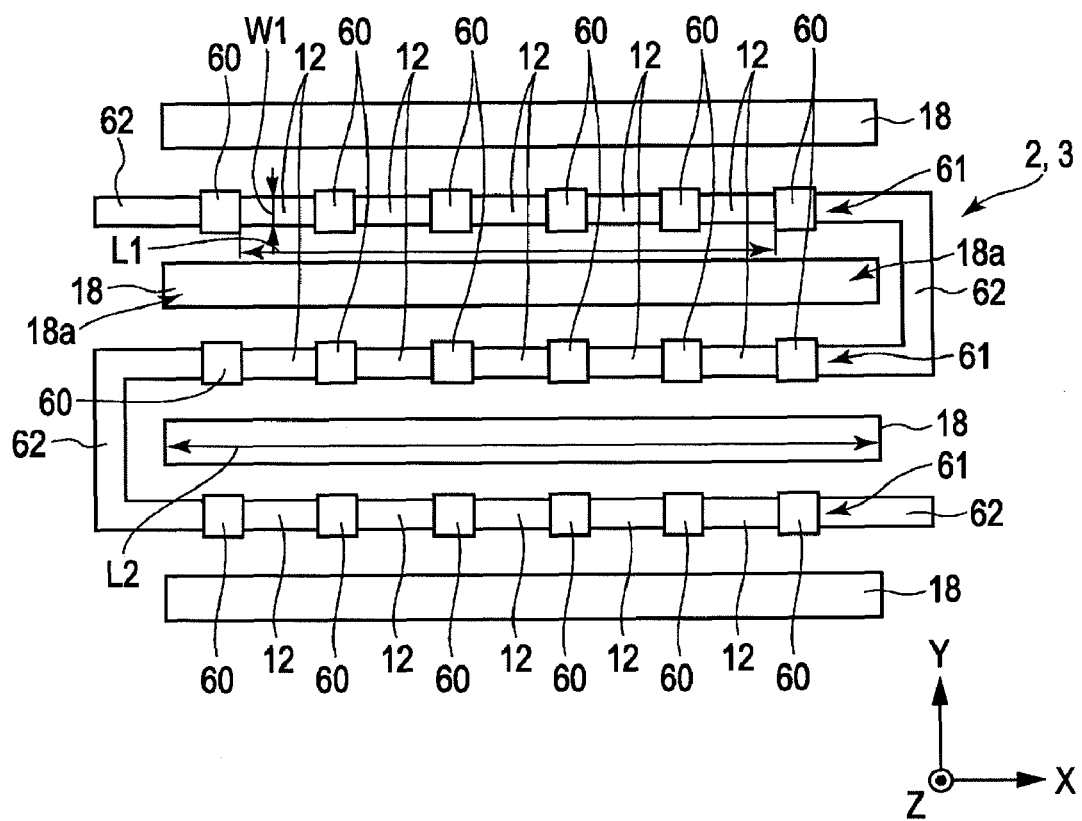
FIG. 11 is a plan view showing a part of a magnetoresistive effect element, in particular, of a magnetic sensor according to an eighth embodiment of the present invention.
Figure 12:
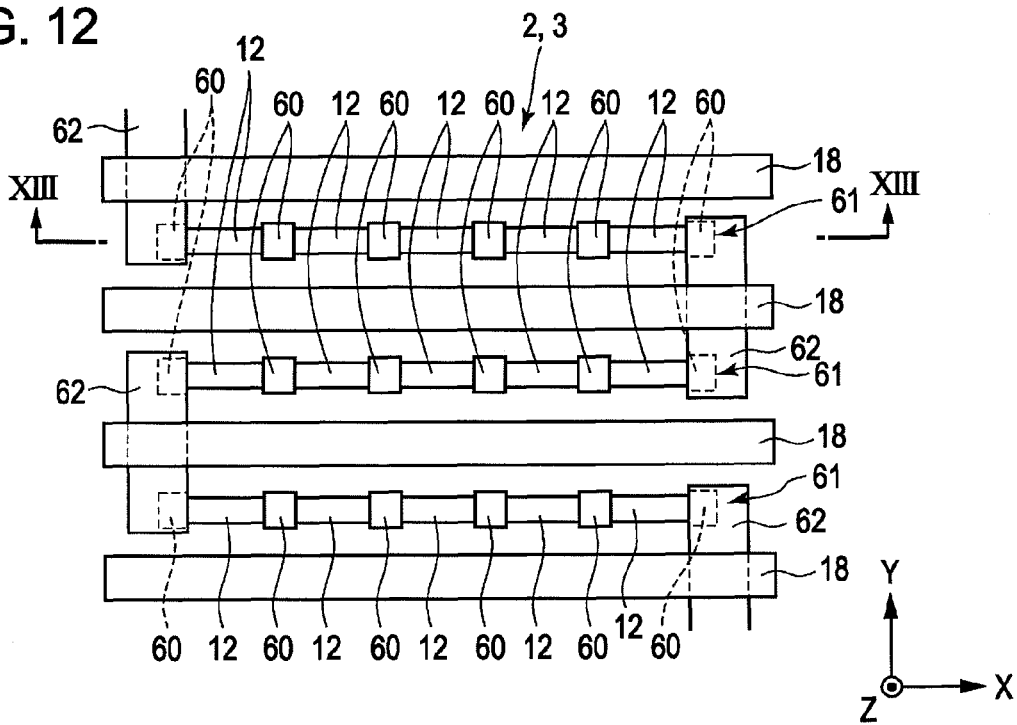
FIG. 12 is a plan view showing a part of a magnetoresistive effect element, in particular, of a magnetic sensor according to a ninth embodiment of the present invention.
Figure 13:
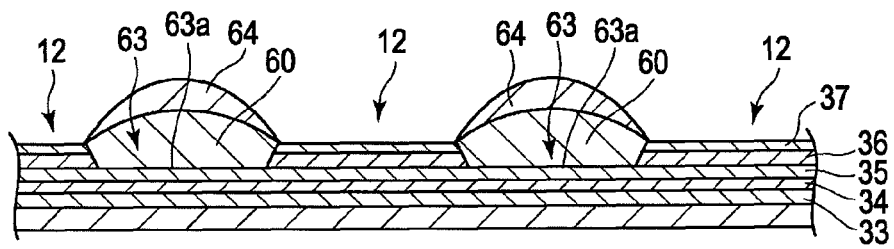
FIG. 13 is a partial expanded cross-section view as seen from an arrow direction while cutting in a height direction (Z direction in the drawing) along the VIII-VIII line of FIG. 12.
Figure 14:
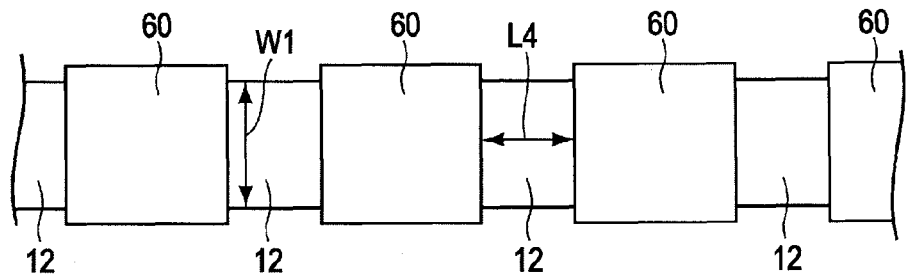
FIG. 14 is a partial expanded cross-section view showing a part of an element unit, in particular, of a magnetoresistive effect element according to a preferred embodiment of the present invention.
Figure 15:
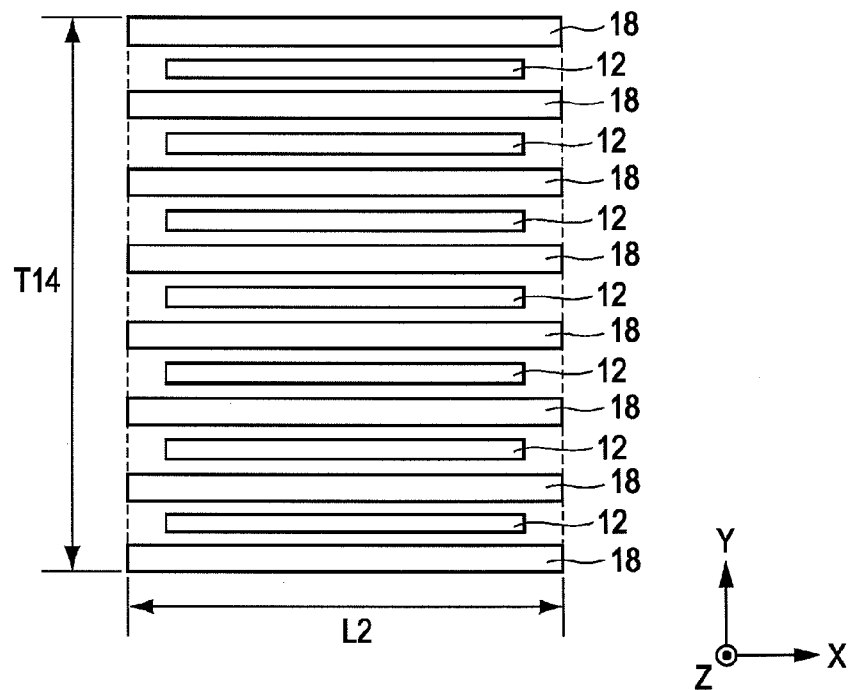
FIG. 15 is a plan view showing a part of a magnetoresistive effect element, in particular, of a magnetic sensor according to a tenth embodiment of the present invention.
Figure 16:
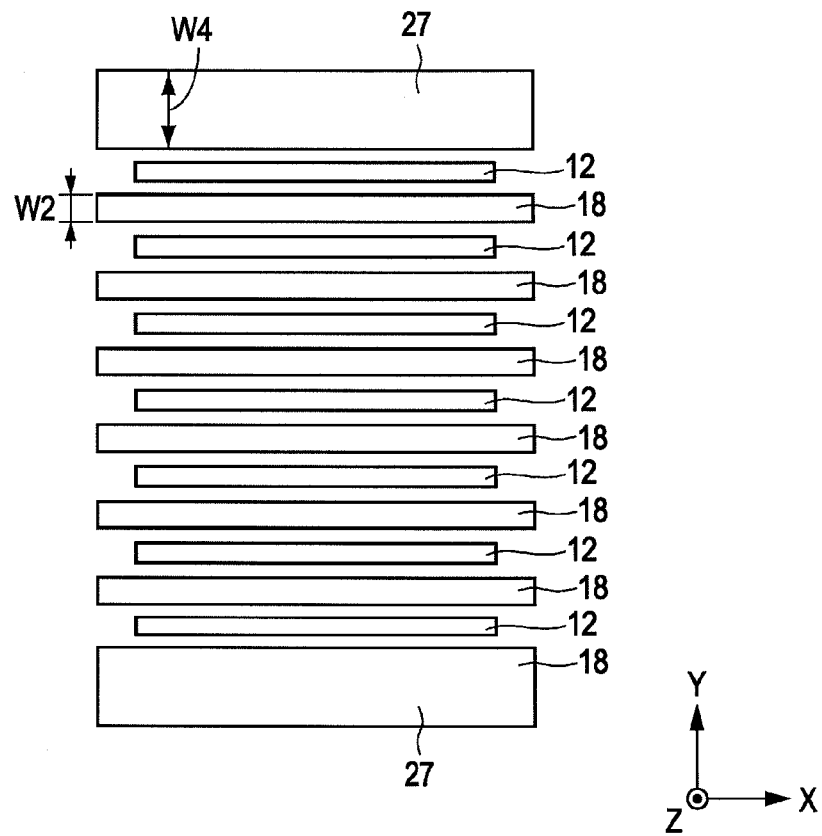
FIG. 16 is a plan view showing a part of a magnetoresistive effect element, in particular, of a magnetic sensor according to an eleventh embodiment of the present invention.
Figure 17:
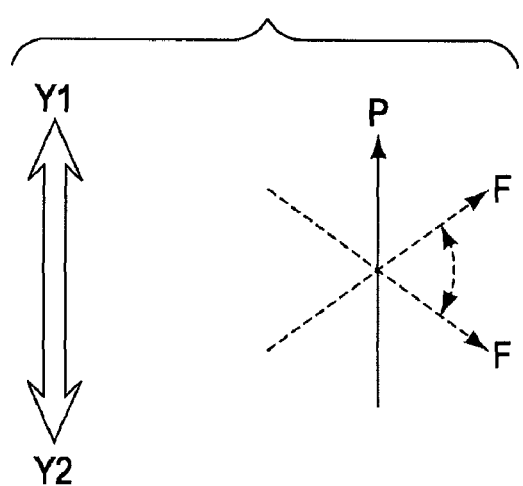
FIG. 17 is an explanatory diagram for describing a relation among a fixed magnetization direction of the fixed magnetic layer in the magnetoresistive effect element, a magnetization direction of a free magnetic layer, and an electric resistance value.
Figure 18:
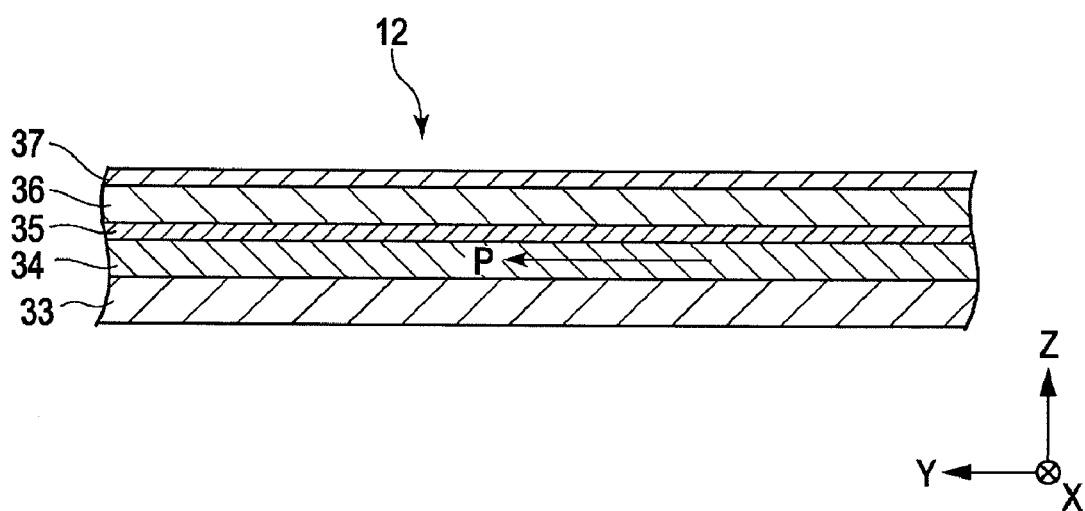
FIG. 18 is a cross-section view showing a cut surface when the magnetoresistive effect element is cut from a film thickness direction.

FIGS. 1A to 1C show a part of a magnetoresistive effect element, in particular, of a magnetic sensor according to a first embodiment of the present invention (FIG. 1A is a partial plan view, and FIG. 1B is a partial cross-section view as seen from an arrow direction while cutting in a height direction (Z direction in the drawing) along the IB-IB line of FIG. 1A); FIGS. 2A and 2B show a part of a magnetoresistive effect element, in particular, of a magnetic sensor according to a second embodiment of the present invention (FIG. 2A is a partial plan view, and FIG. 2B is a partial cross-section view as seen from an arrow direction while cutting in a height direction (Z direction in the drawing) along the IIB-IIB line of FIG. 2A); FIGS. 3A and 3B show a part of a magnetoresistive effect element, in particular, of a magnetic sensor according to a third embodiment of the present invention (FIG. 3A is a partial plan view, and FIG. 3B is a partial cross-section view as seen from an arrow direction while cutting in a height direction (Z direction in the drawing) along the IIIB-IIIB line of FIG. 3A); FIG. 4 is a partial plan view showing a part of a magnetoresistive effect element, in particular, of a magnetic sensor according to a fourth embodiment of the present invention; FIGS. 5A and 5B show a part of a magnetoresistive effect element, in particular, of a magnetic sensor according to a fifth embodiment of the present invention (FIG. 5A is a partial plan view, and FIG. 5B is a partial cross-section view as seen from an arrow direction while cutting in a height direction (Z direction in the drawing) along the VB-VB line of FIG. 5A); FIG. 6A is a partial plan view showing the magnetic sensor provided with the magnetoresistive effect element shown in FIGS. 1A to 1C and a fixed resistance element, and FIG. 6B is a partial cross-section view as seen from an arrow direction while cutting in a height direction (Z direction in the drawing) along the VIB-VIB line of FIG. 6A; FIG. 7A is a partial plan view showing the magnetic sensor provided with the magnetoresistive effect element having a different configuration from FIGS. 6A and 6B and a fixed magnetic layer, and FIG. 7B is a partial cross-section view as seen from an arrow direction while cutting in a height direction (Z direction in the drawing) along the VIIB-VIIB line of FIG. 7A; FIG. 8 is a partial plan view showing a configuration of the fixed resistance element according to a preferred embodiment of the present invention and an image diagram showing a simulation result of a magnetic field; FIG. 9 is a partial plan view showing a part of a magnetoresistive effect element, in particular, of a magnetic sensor according to a sixth embodiment of the present invention; FIG. 10 is a partial plan view showing a part of a magnetoresistive effect element, in particular, of a magnetic sensor according to a seventh embodiment of the present invention; FIG. 11 is a plan view showing a part of a magnetoresistive effect element, in particular, of a magnetic sensor according to an eighth embodiment of the present invention; FIG. 12 is a plan view showing a part of a magnetoresistive effect element, in particular, of a magnetic sensor according to a ninth embodiment of the present invention; FIG. 13 is a partial expanded cross-section view as seen from an arrow direction while cutting in a height direction (Z direction in the drawing) along the VIII-VIII line of FIG. 12; FIG. 14 is a partial expanded cross-section view showing a part of an element unit, in particular, of a magnetoresistive effect element according to a preferred embodiment of the present invention; FIG. 15 is a plan view showing a part of a magnetoresistive effect element, in particular, of a magnetic sensor according to a tenth embodiment of the present invention; FIG. 16 is a plan view showing a part of a magnetoresistive effect element, in particular, of a magnetic sensor according to an eleventh embodiment of the present invention; FIG. 17 is an explanatory diagram for describing a relation among a fixed magnetization direction of the fixed magnetic layer in the magnetoresistive effect element, a magnetization direction of a free magnetic layer, and an electric resistance value; FIG. 18 is a cross-section view showing a cut surface when the magnetoresistive effect element is cut from a film thickness direction; and FIG. 19 is a circuit diagram of a magnetic sensor according to the present embodiment.

A magnetic sensor module using a magnetic sensor 1 provided with magnetoresistive effects element according to the present embodiment is used, for example, as a geomagnetic sensor which is fitted into a mobile device such as a mobile phone.

Figure 19:
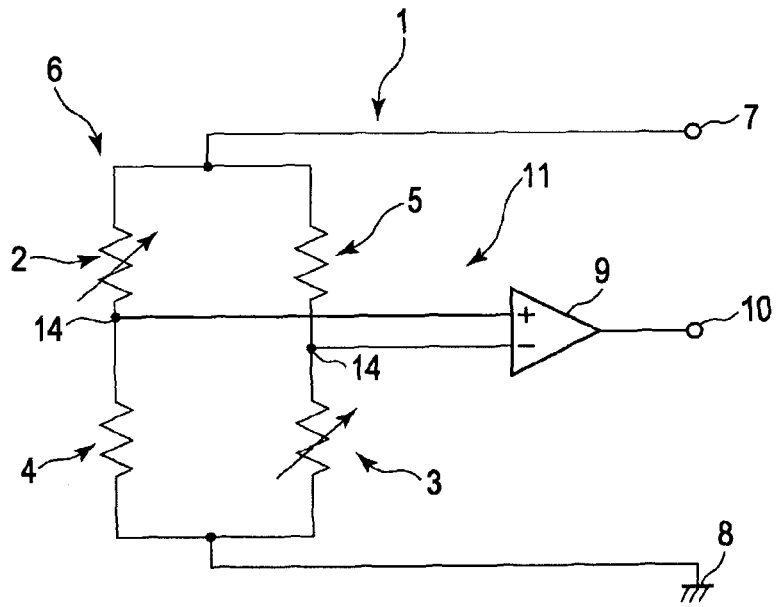
FIG. 19 is a circuit diagram of a magnetic sensor according to the present embodiment of the present invention.

As shown in FIG. 19, the geomagnetic sensor 1 includes a sensor unit 6 composed of magnetoresistive effect elements 2 and 3 and fixed resistance elements 4 and 5 which establish a bridge connection, an input terminal 7 electrically connected to the sensor unit 6, a ground terminal 8, and an integrated circuit (IC) 11 provided with a differential amplifier 9, an external output terminal 10, and the like.

As shown in FIGS. 1A to 1C, in the magnetoresistive effect elements 2 and 3, the plurality of element units 12 formed to have an elongated shape in the X direction shown in the drawing in which the element length L1 is longer than the element width W1 are arranged in parallel at a predetermined gap in the Y direction which is perpendicular to the X direction, and the ends of the respective element units 12 are electrically connected by a connection electrode unit 13 to form a meander shape. To one of the element units 12 located at both ends formed into the meander shape, an electrode unit 15 connected to the input terminal 7, the ground terminal 8, the output taking out unit 14 (see FIGS. 6A and 6B and FIGS. 7A and 7B, and FIG. 19) is connected. The connection electrode unit 13 and the electrode unit 15 are made of a non-magnetic conductive material such as Al, Ta, or Au. Unlike the related art, the connection electrode unit 13 and the electrode unit 15 may not be formed of a hard magnetic material. The connection electrode unit 13 and the electrode unit 15 are formed by way of sputtering or plating.

The respective element units 12 constituting the magnetoresistive effect elements 2 and 3 are all formed in the same laminate structure shown in FIG. 18. It should be noted that FIG. 18 shows a cut surface which is cut from a thickness direction from a direction parallel with the element width W1.

The element unit 12 is formed, for example, by laminating an antiferromagnetic layer 33, a fixed magnetic layer 34, a non-magnetic layer 35, and a free magnetic layer 36 in the stated order from the bottom, and a surface of the free magnetic layer 36 is covered with a protective layer 37. The element unit 12 is formed, for example, by way of sputtering.

The antiferromagnetic layer 33 is formed of an antiferromagnetic material such as an Ir—Mn alloy (iridium-manganese alloy). The fixed magnetic layer 34 is formed of a soft magnetic material such as a Co—Fe alloy (cobalt-iron alloy). The non-magnetic layer 35 is formed of Cu (copper) or the like. The free magnetic layer 36 is formed of a soft magnetic material such as an Ni—Fe alloy (nickel-iron alloy). The protective layer 37 is formed of Ta (tantalum) or the like. According to the above-mentioned configuration, the non-magnetic layer 35 is a giant magnetoresistance element (GMR element) formed of a non-magnetic conductive material such as Cu, but the non-magnetic layer 35 may be a tunnel magnetoresistance effect element (TMR element) formed of an insulating material such as Al2O3. Also, the laminate structure of the element unit 12 shown in FIG. 18 is an example, and another laminate structure may also be adopted. For example, the free magnetic layer 36, the non-magnetic layer 35, the fixed magnetic layer 34, the antiferromagnetic layer 33, and the protective layer 37 may be laminated in the stated order from the bottom.

In the element unit 12, with an antiferromagnetic coupling between the antiferromagnetic layer 33 and the fixed magnetic layer 34, a magnetization direction of the fixed magnetic layer 34 is fixed. As shown in FIGS. 1A to 1C and FIG. 18, the fixed magnetization direction (P direction) of the fixed magnetic layer 34 faces the element width direction (Y direction). That is, the fixed magnetization direction (P direction) of the fixed magnetic layer 34 is perpendicular to the length direction of the element unit 12.

On the other hand, the magnetization direction of the free magnetic layer 36 (F direction) fluctuate due to the external magnetic field.

As shown in FIG. 17, an external magnetic field Y1 is effected from the same direction as the fixed magnetization direction (P direction) of the fixed magnetic layer 34. When the magnetization direction of the free magnetic layer 36 (F direction) faces the external magnetic field Y1, the fixed magnetization direction (P direction) of the fixed magnetic layer 34 and the magnetization direction of the free magnetic layer 36 (F direction) are getting close to be parallel, and an electric resistance value is decreased.

On the other hand, as shown in FIG. 17, an external magnetic field Y2 is effected from a direction opposite to the fixed magnetization direction (P direction) of the fixed magnetic layer 34. When the magnetization direction of the free magnetic layer 36 (F direction) faces the external magnetic field Y2, the fixed magnetization direction (P direction) of the fixed magnetic layer 34 and the magnetization direction of the free magnetic layer 36 (F direction) are getting close to be anti-parallel, and the electric resistance value is increased.

As shown in FIG. 1B, the magnetoresistive effect elements 2 and 3 are formed on a substrate 16. The magnetoresistive effect elements 2 and 3 are covered with an insulating layer 17 formed of Al2O3, SiO2 or the like. Also, the insulating layer 17 fills spaces between the element units 12 constituting the magnetoresistive effect elements 2 and 3. The insulating layer 17 is formed, for example, by way of sputtering.

As in FIG. 1B, an upper surface of the insulating layer 17 is formed into a flat surface, for example, by using a CMP technology. It should be however noted that the upper surface of the insulating layer 17 may also be formed into a surface with concavity and convexity while following a step between the element unit 12 and the substrate 16. The same applies to FIG. 2B, FIG. 3B, and FIG. 5B.

As shown in FIGS. 1A to 1C, first soft magnetic bodies 18 are provided between the respective element units 12 constituting the magnetoresistive effect elements 2 and 3 and on an outside of the outermost element unit 12. The first soft magnetic body 18 is formed into a thin film, for example, by way of sputtering or plating. The first soft magnetic body 18 is formed of NiFe, CoFe, CoFeSiB, CoZrNb, or the like. According to this mode, the width size W2 of the first soft magnetic body 18 is smaller than the element width W1 of the element unit 12. Also, the length size L2 of the first soft magnetic body 18 is longer than the element length L1 of the element unit 12, and as shown in FIG. 1A, the first soft magnetic body 18 has an extension part 18a extending in the length direction from both sides of the length direction of the element unit 12 (X direction).

As shown in FIG. 1B, the first soft magnetic body 18 is formed on the insulating layer 17 located between the element units 12. Also, although not shown in the drawing, an insulating protective layer covers the first soft magnetic body 18 and the spaces between the first soft magnetic bodies 18.

FIG. 1C is a simulation result of the magnetic field when the external magnetic field at 5 Oe is effected from the direction perpendicular to the sensitivity axis (X direction). A shaded location shown in FIG. 1C is a region where a magnetic flux density B of the magnetic field is more intense than other regions, and to be more specific, the magnetic flux density is 8.875e-4 (T) or larger. From this simulation result, when a length size of the extension part 18a is set as T8, and a distance between the respective first soft magnetic bodies 18 is set as T3, it is preferable that the magnetic shield effect with respect to the direction perpendicular to the sensitivity axis can be appropriately improved if T8/T3 is equal to or larger than 3.

According to the present embodiment, it is possible to set the magnetic field from the direction perpendicular to the sensitivity axis to be lower than 100% of the external magnetic field at the element position.

A description will be given of the respective sizes.

The element width W1 of the element units 12 constituting the magnetoresistive effect elements 2 and 3 is in a range of 2 to 6 µm as the shape anisotropy is utilized in the case of being used as the geomagnetic sensor (see FIG. 1A). Also, the element length L1 of the element unit 12 is in a range of 60 to 100 µm (see FIG. 1A). Also, a film thickness T1 of the element unit 12 is in a range of 200 to 300 Å (see FIG. 1B). Also, according to this embodiment, in the case of being used as the geomagnetic sensor, the width size W2 of the first soft magnetic body 18 is in a range of 1 to 6 µm (see FIG. 1A). Also, the length size L2 of the first soft magnetic body 18 is in a range of 80 to 200 µm (see FIG. 1A). Also, a film thickness T2 of the first soft magnetic body 18 is in a range of 0.2 to 1 µm (see FIG. 1B). An aspect ratio of the element unit 12 (element length L1/the element width W1) is equal to or larger than 10 in the case of being used as the geomagnetic sensor. Also, the aspect ratio of the first soft magnetic body 18 (the length size L2/the width size W2) is preferably equal to or larger than the aspect ratio of the element unit 12. Also, a length size T8 of the extension part 18a of the first soft magnetic body 18 is equal to or larger than 20 µm (see FIG. 1A).

A distance between the respective first soft magnetic bodies 18 (distance to the Y direction) T3 according to the embodiment of FIGS. 1A to 1C is equal to or larger than the width W2 of the first soft magnetic body and is 2 to 8 µm (see FIG. 1B). Also, a distance T4 to the Y direction between the first soft magnetic body 18 and the element unit 12 at an adjacent position is 0<T4<3 µm (see FIG. 1B). Also, a distance T5 between the first soft magnetic body 18 and the element unit 12 in the height direction (Z direction) is 0.1 to 1 µm (see FIG. 1B).

Next, according to the embodiment shown in FIGS. 2A and 2B, unlike FIGS. 1A to 1C, the first soft magnetic body 18 is arranged immediately above the respective element units 12 via the insulating layer 17. Also, according to the embodiment shown in FIGS. 3A and 3B, unlike FIGS. 1A to 1C, the first soft magnetic body 18 is arranged immediately below the respective element units 12 via the insulating layer 17. In FIGS. 3A and 3B, a configuration is adopted in which the first soft magnetic body 18 is formed on the substrate 16, the insulating layer 17 is formed on the first soft magnetic body 18 across the substrate 16 between the first soft magnetic bodies 18, and the magnetoresistive effect elements 2 and 3 are formed on an insulating layer 19. As in FIGS. 3A and 3B, according to the mode in which the first soft magnetic body 18 is arranged immediately below the element unit 12, for example, when an annealing processing is desired to be applied on the first soft magnetic body 18, it is possible to carry out the processing before the element unit 12 is formed, and an influence on the element unit 12 can be suppressed.

According to the embodiments shown in FIGS. 2A and 2B and FIGS. 3A and 3B also, similar to FIGS. 1A to 1C, the width size W2 of the first soft magnetic body 18 is smaller than the element width W1. Also, the length size L2 of the first soft magnetic body 18 is longer than the element length L1, and the first soft magnetic body 18 has the extension part 18a extending in the length direction from both sizes of the length direction of the element unit 12 (X direction).

According to the embodiments shown in FIGS. 2A and 2B and FIGS. 3A and 3B, the first soft magnetic body 18 in which the width size W2 is smaller than the element width W1 is arranged so as to be accommodated in the element width W1 of the element unit 12 in the plan view (so as not to protrude in the element width W1 direction).

The element width W1 of the element units 12 constituting the magnetoresistive effect elements 2 and 3 according to the mode shown in FIGS. 2A and 2B and FIGS. 3A and 3B is in a range of 5 to 8 µm. The width size W2 of the first soft magnetic body 18 is narrower than W1 and also is in a range of 2 to 6 μm in the case of being used as the geomagnetic sensor (see FIG. 2A and FIG. 3A).

A distance T6 between the first soft magnetic bodies 18 shown in FIG. 2B and FIG. 3B (distance to the Y direction) is 6 to 10 μm. Also, a distance T7 between the first soft magnetic body 18 and the element unit 12 in the height direction (Z direction) is 0.1 to 1 □m.

The magnetic sensor 1 shown in FIGS. 1A to 1C to FIGS. 3A and 3B is configured to detect the earth magnetism from a direction parallel to the Y direction shown in the drawing (element width direction). Therefore, the Y direction shown in the drawing is the sensitivity axis direction, and the X direction (element length direction) perpendicular to the Y direction shown in the drawing is the length direction of the element unit 12. The fixed magnetization direction (P direction) of the fixed magnetic layer 34 faces the Y direction shown in the drawing which is the sensitivity axis direction.

According to the present embodiment, the first soft magnetic body 18 is provided in a non-contact manner with the element unit 12. Like the element unit 12, the first soft magnetic body 18 has an elongated shape in the element length direction (X direction shown in the drawing), and the element unit 12 and the first soft magnetic body 18 are assigned with the shape anisotropy in which both magnetization easy axis directions become the same direction. Also, a magnetic permeability of the first soft magnetic body 18 is larger than a magnetic permeability of the element unit 12.

Furthermore, the first soft magnetic body 18 according to the present embodiment is provided with the extension part 18a extending in the element length direction from both sides of the element length direction (X direction) of the respective element units 12 constituting the magnetoresistive effect elements 2 and 3.

For this reason, even when the external magnetic field is effected from the element length direction (X direction) perpendicular to the sensitivity axis, the external magnetic field may pass through the first soft magnetic body 18 on a priority basis. Therefore, the magnetic shield effect to the element length direction perpendicular to the sensitivity axis can be appropriately improved. That is, it is possible to set the magnetic field from the direction perpendicular to the sensitivity axis to be lower than 100% of the external magnetic field at the element position.

As described above, when the length size of the extension part 18a is set as T8, and a distance between the respective first soft magnetic bodies 18 is set as T3, T8/T3 is preferably equal to or larger than 3 because the magnetic shield effect with respect to the direction perpendicular to the sensitivity axis can be appropriately improved.

On the other hand, when the magnetic sensor 1 is used as the geomagnetic sensor, the amount of the leak magnetic field of the internal device generated in the mobile device tends to be larger than the earth magnetism amount. The leak magnetic field is supposed to be several Oe or larger (about 5 to 10 Oe) in contrast to the earth magnetism at about several tenths of Oe. Then, according to the present embodiment, even when the above-mentioned leak magnetic field is effected from the sensitivity axis direction, the magnetic saturation can be avoided, and the sensitivity as the magnetic sensor 1 can be appropriately maintained.

According to the present embodiment, the linear region of the resistance change in the magnetoresistive effect elements 2 and 3 is preferably larger than the integration of the disturbance magnetic field flowing from the element width direction (sensitivity axis direction) and the sensed magnetic field. At this time, an anisotropy magnetic field Hk in the magnetoresistive effect elements 2 and 3 is preferably equal to or larger than 20 Oe. The anisotropy magnetic field Hk is affected by the aspect ratio of the element unit 12. By setting the element width W1 small with respect to the element length L1, the anisotropy magnetic field Hk can be set large, but if the anisotropy magnetic field Hk is set too large, a resistance change rate per unit magnetic field becomes extremely small. At this time, by providing the first soft magnetic body 18, the sensitivity as the sensor can be appropriately maintained.

Figure 20:
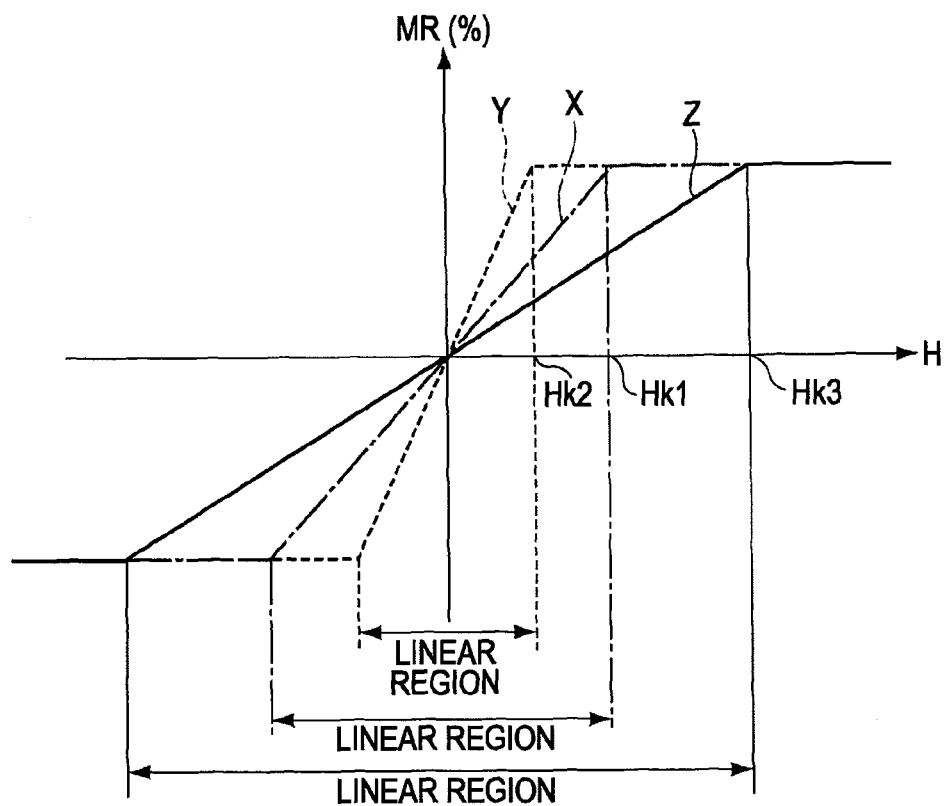
FIG. 20 is a graph representing a relation between an intensity H of the magnetic field from the sensitivity axis and a resistance change rate (MR ratio) per unit magnetic field of the magnetoresistive effect element.

FIG. 20 is a graph representing a relation between the intensity H of the magnetic field from the sensitivity axis and the resistance change rate per unit magnetic field (MR ratio) of the magnetoresistive effect elements 2 and 3. The aspect ratio of the element unit 12 is constant. A dashed-dotted line X represented in FIG. 20 is a result in the related art structure where the first soft magnetic body 18 is not provided. The magnitude of the external magnetic field H when the resistance change rate per unit magnetic field (MR ratio) is maximum or minimum is the magnitude of the anisotropy magnetic field Hk1.

If the intensity H of the magnetic field from the sensitivity axis affecting the magnetoresistive effect elements 2 and 3 is amplified more than the actual magnitude by the first soft magnetic body 18, the magnetoresistive effect elements 2 and 3 reach the magnetic saturation in an early stage. That is, as represented by a dotted line Y of FIG. 20, the anisotropy magnetic field Hk2 becomes apparently small, and the linear region (sensitivity region) where fluctuate the resistance change rate per unit magnetic field (MR ratio) of the magnetoresistive effect elements 2 and 3 with respect to the intensity change of the magnetic field is narrowed. Therefore, the detection accuracy with respect to the earth magnetism tends to decrease.

On the other hand, if the intensity H of the magnetic field from the sensitivity axis affecting the magnetoresistive effect elements 2 and 3 is set smaller than the actual magnitude by the first soft magnetic body 18, as represented by a solid line Z of FIG. 20, the anisotropy magnetic field Hk3 of the magnetoresistive effect elements 2 and 3 becomes apparently large, and the linear region (sensitivity region) can be widened. That is, it is possible to establish a situation where the magnetic saturation does not occur with respect to the magnetic field from the sensitivity axis direction.

According to the present embodiment, it is not intended to exclude a situation where the intensity H of the magnetic field from the sensitivity axis affecting the magnetoresistive effect elements 2 and 3 is amplified more than the actual magnitude. That is, even when amplified, as described above, through an adjustment of the anisotropy magnetic field Hk by the element unit 12 itself or the like, the linear region of the resistance change in the magnetoresistive effect elements 2 and 3 can be set larger than the integration of the disturbance magnetic field flowing from the element width direction (sensitivity axis direction) and the sensed magnetic field.

Also, according to the present embodiment, it is possible to set the gain of the magnetic field intensity affecting on the element unit 12 when the external magnetic field flows in from the element width direction to be equal to or larger than 50% and equal to or smaller than 100%. When an intensity of the external magnetic field affecting on the magnetoresistive effect elements 2 and 3 when the external magnetic field at a certain intensity flows into the element width direction which is the sensitivity axis in the mode in which the first soft magnetic body 18 is not provided is set as B, and an intensity of the external magnetic field affecting on the magnetoresistive effect elements 2 and 3 according to the present embodiment in which the first soft magnetic body 18 is provided is set as C, the "gain" is represented by (the intensity C/the intensity B)×100(%).

Alternatively, in other words, when an inclination in the linear region shown in FIG. 20 for the resistance change rate per unit magnetic field (MR ratio) of the magnetoresistive effect elements 2 and 3 when the external magnetic field flows in from the sensitivity axis direction in the mode in which the first soft magnetic body 18 is not provided is set as X, and an inclination in the linear region shown in FIG. 20 for the resistance change rate per unit magnetic field (MR ratio) of the magnetoresistive effect elements 2 and 3 according to the present embodiment in which the first soft magnetic body 18 is provided is set as Z, the gain of the resistance change rate per unit magnetic field [(the inclination Z/the inclination X)□100(%)] is preferably equal to or larger than 50% and equal to or smaller than 100%. That is, a situation where the gain is equal to or smaller than 100% means that the inclination in the linear region shown in FIG. 20 becomes small, and the linear region is widened. On the other hand, if the gain is smaller than 50%, due to the decrease in the sensitivity, the detection accuracy is decreased, and therefore the gain is set to be equal to or larger than 50%.

It should be noted that when the external magnetic field flows in from the element width direction, the magnetic field intensity affecting on the element unit 12 is amplified or attenuated, the resistance change rate per unit magnetic field (MR ratio) of the magnetoresistive effect elements 2 and 3 is amplified or attenuated.

Also, according to the present embodiment, when the external magnetic field flows in from the element length direction perpendicular to the sensitivity axis direction, the attenuation rate of the magnetic field intensity affecting on the element unit 12 is necessarily equal to or smaller than 100%, and further, preferably equal to or smaller than 20%. When an intensity of the external magnetic field affecting on the magnetoresistive effect elements 2 and 3 when the external magnetic field at a certain intensity flows in the element length direction perpendicular to the sensitivity axis in the mode in which the first soft magnetic body 18 is not provided is set as F, and an intensity of the external magnetic field affecting on the magnetoresistive effect elements 2 and 3 according to the present embodiment in which the first soft magnetic body 18 is provided is set as G, the "attenuation rate" is represented by [[(the intensity F−the intensity G)/the intensity F]×100(%)].

Alternatively, in other words, when a resistance change rate per unit magnetic field (MR ratio) of the magnetoresistive effect elements 2 and 3 when the external magnetic field flows in from the direction perpendicular to the sensitivity axis in the mode in which the first soft magnetic body 18 is not provided is set as H, and a resistance change rate per unit magnetic field (MR ratio) of the magnetoresistive effect elements 2 and 3 according to the present embodiment in which the first soft magnetic body 18 is provided is set as I, the attenuation rate of the resistance change rate per unit magnetic field [(H−I/H)×100(%)]is necessarily equal to or smaller than 100%, and further, preferably equal to or smaller than 20%.

Then, it is desired that [the resistance change rate per unit magnetic field in transverse magnetic field/the resistance change rate per unit magnetic field in the sensitivity axis direction]×100(%)=10% or smaller.

According to the present embodiment, in order to set that the above-mentioned gain is equal to or larger than 50% and equal to or smaller than 100%, the width size W2 of the first soft magnetic body 18 is preferably set smaller than the element width W1 of the element unit 12. It should be however noted that it is not intended to exclude a mode in which the width size W2 of the first soft magnetic body 18 is set as the same as the element width W1 of the element unit 12 or the width size W2 is set to be larger than the element width W1.

Also, according to the present embodiment, the gap T3 of the respective first soft magnetic bodies is preferably larger than the width size W2 of the first soft magnetic body.

Also, for example, if the length size T8 of the extension part 18a of the first soft magnetic body 18 becomes too long with respect to the distances T3 and T6 between the first soft magnetic bodies 18, the gain is increased, and on the contrary, if the length size T8 of the extension part 18a becomes too short, the shield effect with respect to the external magnetic field from the element length direction perpendicular to the sensitivity axis is not sufficient. Therefore, by setting the distances T3 and T6 between the first soft magnetic bodies 18 and the length size T8 of the extension part 18a of the first soft magnetic body 18 to be accommodated in the above-mentioned numeric ranges, and also, by setting the aspect ratio (T8/T3) between the distance T3 between the first soft magnetic bodies 18 and the length size T8 of the extension part 18a as 3 or larger, the shield effect with respect to the external magnetic field from the element length direction perpendicular to the sensitivity axis can be sufficient, and the attenuation rate can be set as 20% or smaller.

Also, like the embodiment shown in FIGS. 1A to 1C, in the configuration in which the first soft magnetic body 18 is arranged on the lateral side of the element unit 12, in order to adjust the gain, other than the width size W2 of the first soft magnetic body 18, the distance T4 between the element unit 12 and the first soft magnetic body 18 to the Y direction (see FIG. 1B) and the distance T5 between the element unit 12 and the first soft magnetic body 18 to the height direction (FIG. 1B) are also important parameters.

In addition, as in FIG. 4, even when the width size W2 of the first soft magnetic body 18 is the same as the element width W1 of the element unit 12, or as in FIGS. 5A and 5B, even when the width size W2 of the first soft magnetic body 18 is larger than the element width W1 of the element unit 12, by appropriately adjusting a distance T9 between the element unit 12 and the first soft magnetic body 18 to the Y direction (FIG. 5B) and a distance T10 between the element unit 12 and the first soft magnetic body 18 in the height direction (FIG. 5B) also, the gain can be accommodated in the range of 50% to 100%.

As in FIG. 4 and FIGS. 5A and 5B, in a case where the width size W2 of the first soft magnetic body 18 is set to be equal to or larger than the element width W1, preferably, the size W1 is in a range of 2≦W1≦4 μm, and the width size W2 is in a range of 2<W2<6 μm. At this time, (the width size W2/the element width W1) is preferably 1 to 3. Also, the distance T9 between the element unit 12 and the first soft magnetic body 18 to the Y direction is preferably in a range of 0 to 3 μm. Also, the distance T10 between the element unit 12 and the first soft magnetic body 18 in the height direction is preferably in a range of 0.1 to 1 μm. A distance T12 between the first soft magnetic bodies 18 in the Y direction is preferably in a range of 2≦T12≦6 μm.

Preferable examples of the respective embodiments will be illustrated below.

In the case of the embodiment of FIGS. 1A to 1C, the element width W1 of the element unit 12 is 5 μm, the element length L1 is 60 μm, the width size W2 of the first soft magnetic body 18 is 2 μm, the length size L2 is 100 μm, the distance T3 the respective first soft magnetic bodies 18 to the Y direction is 9 μm, the distance T4 between the element unit 12 and the first soft magnetic body 18 to the Y direction is 2 μm, the distance T5 between the element unit 12 and the first soft magnetic body 18 to the height direction is 0.3 μm.

In the case of the embodiment of FIGS. 2A and 2B, the element width W1 of the element unit 12 is 6 μm, the element length L1 is 60 μm, the width size W2 of the first soft magnetic body 18 is 2 μm, the length size L2 is 100 μm, the distance T6 between the respective first soft magnetic bodies 18 is 6 μm, and the distance T7 between the element unit 12 and the first soft magnetic body 18 in the height direction is 0.3 μm.

In the case of the embodiment of FIGS. 3A and 3B, the element width W1 of the element unit 12 is 6 μm, the element length L1 is 60 μm, the width size W2 of the first soft magnetic body 18 is 2 □m, the length size L2 is 100 μm, the distance T6 between the respective first soft magnetic bodies 18 is 6 μm, and the distance T7 between the element unit 12 and the first soft magnetic body 18 in the height direction is 0.3 □m.

Also, in the case of the embodiment of FIGS. 5A and 5B, the element width W1 of the element unit 12 is 3 μm, the element length L1 is 60 μm, the width size W2 of the first soft magnetic body 18 is 4 μm, the length size L2 is 100 μm, the distance T12 between the respective first soft magnetic bodies 18 to the Y direction is 7 μm, the distance T9 between the element unit 12 and the first soft magnetic body 18 to the Y direction is 2 μm, and the distance T10 between the element unit 12 and the first soft magnetic body 18 in the height direction is 0.3 μm.

With the above-mentioned configuration, the shield effect is appropriately exercised with respect to the magnetic field at about several Oe from the direction perpendicular to the sensitivity axis, and the resistance change rate per unit magnetic field (MR ratio) can be set as substantially zero. In addition, even when the leak magnetic field at about several Oe from the sensitivity axis direction is effected, the magnetic saturation does not occur, and the sensitivity is appropriately maintained.

FIGS. 6A and 6B and FIGS. 7A and 7B illustrate the fixed resistance elements 4 and 5 connected in series to the magnetoresistive effect elements 2 and 3. A mode of the magnetoresistive effect elements 2 and 3 illustrated in FIGS. 6A and 6B and FIGS. 7A and 7B is the same as that illustrated in FIGS. 1A to 1C, and therefore a particular description will be omitted. It should be noted that in FIGS. 6A and 6B and FIGS. 7A and 7B, the first soft magnetic body 18 is located at a lateral side of the element unit 12, but the first soft magnetic body 18 may be located immediately above the element unit 12 as in FIGS. 2A and 2B or may be located immediately below the element unit 12 as in FIGS. 3A and 3B.

The fixed resistance elements 4 and 5 are also provided with the same element unit 12 as the magnetoresistive effect elements 2 and 3. That is, the laminate structure described in FIG. 18 is provided, the element width is W1, and the element length is L1. The element width W1 is about 2 to 6 μm in the case of being used as the geomagnetic sensor. Also, the element units 12 constituting the fixed resistance elements 4 and 5 also obtain the meander shape as the ends are mutually connected via the connection electrode unit 13.

According to the embodiment of FIGS. 6A and 6B, the meander shape of the fixed resistance elements 4 and 5 is matched with a shape obtained by rotating the meander shape of the magnetoresistive effect elements 2 and 3 by 90° in the counterclockwise. The fixed resistance elements 4 and 5 is covered with the insulating layer 17, and a second soft magnetic body 23 is arranged above the fixed resistance elements 4 and 5 via the insulating layer 17. The first soft magnetic body 18 and the second soft magnetic body 23 are preferably formed in a same film structure and in a same creation process.

The second soft magnetic body 23 is formed with the width size W3 in the same direction as the element width W1 (X direction) constituting the fixed resistance elements 4 and 5 and the length size L3 in the same direction as the element length L1 (Y direction). The width size W3 is larger than the element width W1, and the second soft magnetic body 23 is provided with an extension part 23a extending in the element width direction from both sides of the element width of the element unit 12. Also, the length size L3 is larger than the element length L1, and the second soft magnetic body 23 is provided with an extension part 23a extending in the element length direction from both sides of the element unit 12 in the element length direction (Y direction). Also, the length size L3 is larger than the width size W3. That is, the second soft magnetic body 23 is formed to have an elongated shape in the Y direction shown in the drawing.

As described above, the fixed magnetization direction (P direction) of the fixed magnetic layer 34 of the magnetoresistive effect elements 2 and 3 faces the element width direction (Y direction). Also, in the mode of FIGS. 6A and 6B, the fixed magnetization direction (P direction) of the fixed magnetic layer 34 of the fixed resistance elements 4 and 5 faces the element length direction (Y direction). In the mode of FIGS. 6A and 6B, as the element units 12 constituting the magnetoresistive effect elements 2 and 3 and the element units 12 constituting the fixed resistance elements 4 and 5 in a relation to be perpendicular to each other, the fixed magnetization direction (P direction) of the fixed magnetic layer 34 of the magnetoresistive effect elements 2 and 3 is matched with the fixed magnetization direction (P direction) of the fixed magnetic layer 34 of the fixed resistance elements 4 and 5.

The width size W3 of the second soft magnetic body 23 is 6 to 10 μm and also is larger than the element width W1. Also, the length size L3 of the second soft magnetic body 23 is longer than the element length L1 and also is 80 to 200 μm. An aspect ratio of the second soft magnetic body 23 (the length size L2/the width size W2) is equal to or larger than 10. Also, a distance T11 between the second soft magnetic bodies 23 (distance to the X direction) is equal to or larger than 2 μm. A relation between the width T11 between the adjacent second soft magnetic bodies and the width W3 of the second soft magnetic body is T11<W3.

A film thickness of the second soft magnetic body 23 is the same as the thickness of the first soft magnetic body 18, and a distance between the second soft magnetic body 23 and the element unit 12 in the height direction (Z direction) is the same as the distance between the first soft magnetic body 18 and the element unit 12 in the height direction (Z direction).

According to the embodiment of FIGS. 6A and 6B, as the same element units 12 are used for the magnetoresistive effect elements 2 and 3 and the fixed resistance elements 4 and 5, the temperature coefficients of resistance (TCR) for the magnetoresistive effect elements 2 and 3 and the fixed resistance elements 4 and 5 can be set equal to each other. Also, as the resistance values are equal to each other, it is not necessary to perform a patterning step for matching the resistance values with each other.

Also, above the fixed resistance elements 4 and 5, the element units 12 of the fixed resistance elements 4 and 5 are covered up as seen on the plan view, and by arranging the second soft magnetic body 23 having the elongated shape in which the length size L3 is formed to be longer than the width size W3 on the opposite side, the external magnetic field flowing into the element units 12 constituting the fixed resistance elements 4 and 5 can be appropriately shielded. Also, a magnetic permeability of the second soft magnetic body 23 is larger than the magnetic permeability of the element unit 12.

For this reason, almost all the external magnetic field flows on the second soft magnetic body 23 side, the external magnetic field flowing into the element unit 12 can be set extremely small, and the resistance change rate per unit magnetic field (MR ratio) in the element units 12 constituting the fixed resistance elements 4 and 5 can be set extremely small. In a case where the magnetic sensor 1 is the geomagnetic sensor, the external magnetic field obtained by combining the earth magnetism with the leak magnetic field generated inside the device is about 5 to 10 Oe, and at this time, the resistance change rate per unit magnetic field (MR ratio) for the fixed resistance elements 4 and 5 can be suppressed to 0.2% or lower.

In view of the above, an important point for constructing the fixed resistance elements 4 and 5 resides in that the fixed magnetization direction (P direction) of the fixed magnetic layer 34 of the element units 12 constituting the fixed resistance elements 4 and 5 faces the element length direction, and further, as described above, the second soft magnetic body 23 arranged above the element unit 12 is formed to have the elongated shape still facing the length direction of the element unit 12 at the size where the element unit 12 is covered up as seen on the plan view. With this configuration, the element unit 12 and the second soft magnetic body 23 are assigned with the shape anisotropy in which the magnetization easy axis directions are both the same direction. Also, the fixed magnetization direction (P direction) of the fixed magnetic layer 34 and the magnetism direction of the free magnetic layer face the magnetization easy axis direction. With the above-mentioned configuration, it is found out that the realization of the fixed resistance can be performed appropriately.

On the other hand, the fixed resistance elements 4 and 5 according to the embodiment shown in FIGS. 7A and 7B have the same shape after the fixed resistance elements 4 and 5 shown in FIGS. 6A and 6B is rotated by 90° in the clockwise direction. In FIGS. 7A and 7B, the element unit 1 constituting the magnetoresistive effect elements 2 and 3 and the element units 12 constituting the fixed resistance elements 4 and 5 are both arranged while the X direction shown in the drawing is set as the element length direction (longitudinal direction). The fixed magnetization direction (P direction) of the fixed magnetic layer 34 constituting the fixed resistance elements 4 and 5 is the Y direction which is the element width direction as in the magnetoresistive effect elements 2 and 3.

A size relation according to FIGS. 7A and 7B is the same as that of FIGS. 6A and 6B. That is, the width size W3 of the second soft magnetic body 23 is larger than the element width W1 and also is in a range of 6 to 10 μm. The length size L3 is longer than the element length L1 and also is in a range of 80 to 200 μm. The relation between the width T11 between the adjacent second soft magnetic bodies and the width W3 of the second soft magnetic body is T11<W3.

According to the embodiment of FIGS. 7A and 7B also, above the element unit 12, the second soft magnetic body 23 at the size at which the element unit 12 is covered up is provided, and by adjusting the width size W3 of the second soft magnetic body 23 and the length size L3, with the shield effect of the second soft magnetic body 23, the element units 12 constituting the fixed resistance elements 4 and 5 can be subjected to the realization of the fixed resistance appropriately.

In the above, the magnetoresistive effect elements 2 and 3 and the element units 12 constituting the fixed resistance elements 4 and 5 are preferably formed in the same film structure and in the same creation process in order to set both the resistance values equal to each other, but, for example, the element width W1 of the element units 12 constituting the fixed resistance elements 4 and 5 and the element width W1 of the element units 12 constituting the magnetoresistive effect elements 2 and 3 may be different from each other, and also the element length L1 of the element units 12 constituting the fixed resistance elements 4 and 5 and the element length L1 constituting the magnetoresistive effect elements 2 and 3 may be different from each other.

It should be noted that according to the present embodiment, the fixed resistance elements 4 and 5 may be formed of a non-magnetic resistive material as in the related art, or by changing the lamination order for the element units 12 constituting the magnetoresistive effect elements 2 and 3, for example, the antiferromagnetic layer 33, the fixed magnetic layer 34, the free magnetic layer 36, the non-magnetic layer 35, and the protective layer 37 may be laminated in the stated order from the bottom to carry out the realization of the fixed resistance (in either case, it is not necessary to form the second soft magnetic body 23).

Also, the second soft magnetic body 23 may be located below the element unit 12. Also, the second soft magnetic body 23 is formed on both upper and lower sides or one side of the element unit 12.

Another embodiment shown in FIG. 9 relates to a partially revised configuration of the magnetic sensor 1 shown in FIG. 1A. In FIG. 9, a first soft magnetic body 24 is formed on a further outside of the first soft magnetic body 18 which is located at a position further outside of the element units 12 constituting the magnetoresistive effect elements 2 and 3 located on both sides in the element width direction.

Also, another embodiment shown in FIG. 10 relates to a partially revised configuration of the magnetic sensor 1 shown in FIG. 2A. In FIG. 10, the first soft magnetic body 24 is formed at a position further outside of both lateral surfaces 12a of the element units 12 constituting the magnetoresistive effect elements 2 and 3 located on both sides in the element width direction.

As in FIG. 9 and FIG. 10, by providing the first soft magnetic body 24 at the position further outside of the element unit 12, it is possible to more efficiently improve the magnetic shield effect with respect to the magnetic field from the direction perpendicular to the sensitivity axis direction.

For any of the embodiments shown in FIGS. 3A and 3B to FIGS. 5A and 5B, the configuration of providing the first soft magnetic body 24 can be applied.

Also, according to the embodiments of FIGS. 6A and 6B and FIGS. 7A and 7B, if a second soft magnetic body 25 is formed at a location further outside of the lateral surfaces 12a of the element units 12 constituting the fixed resistance elements 4 and 5 located on both sides in the element width direction (for example, see a dotted line of FIG. 6A and FIG. 6B), the performance as the fixed resistance can be improved more effectively as it is difficult for the magnetic field to penetrate into the element unit 12.

FIG. 8 shows a simulation result of the magnetic field with respect to the fixed resistance elements 4 and 5. In the simulation, the external magnetic field at 5 Oe is effected, and a shaded location is a region where the magnetic flux density B of the magnetic field is more intense than other regions, and, to be more specific, the magnetic flux density is 7.75e-4 (T) or higher. As shown in FIG. 8, if the second soft magnetic body 25 is formed at the location further outside of the lateral surfaces 12a of the element units 12 constituting the fixed resistance elements 4 and 5 located at both sides in the element width direction, the area where the magnetic flux density of the magnetic field is intense can be prevented from affecting on the element unit 12 located at the outermost position.

According to another embodiment shown in FIG. 11, the plurality of element units 12 are arranged in parallel with a gap in the element length direction, and a permanent magnet layer 60 is provided at a gap between the respective element units 12. With this configuration, the element connection body 61 composed of the respective element units 12 and the permanent magnet layer 60 extends in a band shape in the X direction shown in the drawing. Also, the permanent magnet layers 60 are provided on both sides of the element units 12 located on both sides of the element connection body 61 in the X direction shown in the drawing. An element length L1 of an element connection body 61 is formed so as to be larger than the element width W1. The plural element connection bodies 61 are arranged in parallel with a gap in the element width direction (Y direction), and the ends of the respective element connection bodies 61 are connected by a connection layer 62 to constitute the magnetoresistive effect elements 2 and 3 having the meander shape. It should be noted that the connection layer 62 is preferably composed of a non-magnetic electrode instead of the permanent magnet because the parasitic resistance can be set small.

According to the present embodiment, as the meander shape in which the total element length is long is adopted by coupling the plurality of element units 12 to the permanent magnet layer 60 and the connection layer 62, the element resistance can be set large, and the consumed power can be reduced.

Also, according to the present embodiment, the plurality of element units 12 and the permanent magnet layer 60 form the element connection body 61, and a plurality of element connection bodies 61 are arranged in parallel in the element width direction to connect the ends of the respective element connection bodies 61 by the connection layer 62. Therefore, as compared with a mode in which all the element units 12 are arranged in parallel with a gap in the element width direction (Y direction) and the ends of the respective element units 12 are coupled by the connection layer 62 (a mode in which the permanent magnet layer 60 is not provided), the length size of the magnetoresistive effect elements 2 and 3 to the element width direction (Y direction) can be set small.

According to this embodiment shown in FIG. 11 also, similar to FIGS. 1A to 1C, the first soft magnetic bodies 18 are formed between the respective element connection bodies 61 and at a location outside the element connection body 61 located at the outermost position in the element width direction. As shown in FIG. 11, the length size L2 of the first soft magnetic body 18 is longer than the element length L1 of the element connection body 61. Also, the first soft magnetic body 18 is provided with the extension part 18a extending from both sides in the element length direction of the element connection body 61 in the element length direction.

FIG. 12 is a modified example of FIG. 11. According to an embodiment shown in FIG. 12, in the magnetoresistive effect elements 2 and 3, the connection layer 62 connecting the ends of the element connection body 61 is formed in a straight line manner (band shape) in the Y direction, and the connection layer 62 passes a lower side of the first soft magnetic body 18 via the insulating layer. That is, the connection layer 62 intersects with the first soft magnetic body 18 in the height direction (Z direction shown in the drawing). The connection layer 62 is formed of a good conductor such as Al, Au, or Cu.

It suffices that if the electrode layer 62 is electrically insulated from the soft magnetic body 18, and the electrode layer 62 may be formed on an upper part of the soft magnetic body 18.

In FIG. 11, the connection layer 62 is formed so as to bypass the first soft magnetic body 18 on a plan view basis, but in FIG. 12, as the connection layer 62 intersects with the first soft magnetic body 18 in the height direction (Z direction shown in the drawing), the length size of the magnetoresistive effect elements 2 and 3 in the X direction shown in the drawing can be set small, and also the wiring resistance of the electrode layer 62 which does not involve the magnetoresistance effect can be reduced, so that the characteristic of the sensor is improved. Also, as the insulation property between the connection layer 62 and the first soft magnetic body 18 is low, even if a short circuit occurs, the short circuit does not occur on a side opposite to the side of the intersection with the insulating layer 19 having the meander shape, and a bypass circuit is not generated. Therefore, the sensor characteristic is not affected so much. Also, by forming the connection layer 62 of a non-magnetic good conductor, the parasitic resistance can be reduced as compared with the mode in which the connection layer 62 is formed of the permanent magnet layer. If the connection layer 62 is formed of the permanent magnet layer, the influence of the bias magnetic field affects the first soft magnetic body 18 to decrease the shield effect, but according to the present embodiment, such a problem does not occur.

As shown in a cross-section view of FIG. 13, the antiferromagnetic layer 33, the fixed magnetic layer 34, and the non-magnetic layer 35 constituting the respective element units 12 are integrated without being segmentalized at the formation position of the permanent magnet layer 60. That is, at the formation position of the permanent magnet layer 60, the protective layer 37 and the free magnetic layer 36 constituting the element unit 12 are shaven off through ion milling or the like to form a concave section 63. Therefore, through a bottom surface 63a of the concave section 63, the non-magnetic layer 35 is exposed. It should be noted that a part of the non-magnetic layer 35 is also shaven off, and the concave section 63 may be formed. Then, the permanent magnet layer 60 is provided in the concave section 63. With the configuration of FIG. 13, as the fixed magnetic layer 34 is not segmentalized, the magnetism of the fixed magnetic layer 34 is stabled in the Y direction shown in the drawing, and uniaxial anisotropy can be improved. Also, in a configuration in which up to the fixed magnetic layer 34 and the antiferromagnetic layer 33 are segmentalized and the permanent magnet layer 60 is provided between the respective element units 12, the electric contact between the permanent magnet layer 60 and the element unit 12 is at the respective lateral surfaces, and the parasitic resistance tends to be large. However, as in the present embodiment, the electric contact between the permanent magnet layer 60 and the element unit 12 is the planar contact, and therefore, the parasitic resistance can be reduced.

Also, as shown in FIG. 13, on an upper surface of the permanent magnet layer 60, a low resistance layer 64 having a resistance value smaller than the permanent magnet layer 60 is overlapped to be formed. The low resistance layer 64 is preferably formed of a non-magnetic good conductor such as Au, Al, or Cu. Similar to the permanent magnet layer 60, the low resistance layer 64 is formed by way of sputtering, plating, or the like. As shown in FIG. 13, by overlapping and forming the low resistance layer 64 on the permanent magnet layer 60, the parasitic resistance component which does not contribute to the magnetic resistance change can be reduced more efficiently.

Also, when an aspect ratio of the element unit 12 (the element length L4/the element width W1) (see FIG. 14) at a part sandwiched by the permanent magnet layers 60 becomes large, the bias magnetic field from the permanent magnet layer 60 is not appropriately supplied to the entire element unit 12. For this reason, the magnetic field from the perpendicular direction (X direction) with respect to the sensitivity axis direction is effected, and hysteresis tends to occur in the resistance change region when the magnetic field intensity is gradually increased. Therefore, as the resistance change area with respect to the magnetic field from the perpendicular direction (disturbance magnetic field) is widened, the disturbance magnetic field tolerance tends to be decreased. Therefore, in order to improve the disturbance magnetic field tolerance by appropriately supplying the bias magnetic field to the entire element unit 12, the aspect ratio of the element unit 12 is preferably small. To be more specific, the aspect ratio of the element unit 12 is preferably equal to or smaller than 3 and more preferably smaller than 1.

As in FIG. 11 and FIG. 12, in the configuration of combining the element unit with the permanent magnet layer, the gain of the magnetic field intensity affecting on the element unit when the external magnetic field flows in from the element width direction can be adjusted to equal to or larger than 50% and equal to or smaller than 200%. Also, the gain of the resistance change rate per unit magnetic field of the magnetoresistive effect element when the external magnetic field flows in from the element width direction can be adjusted to equal to or larger than 50% and equal to or smaller than 200%.

According to another embodiment shown in FIG. 15, when a distance between the outer surfaces of the first soft magnetic body 18 located on both sides in the sensitivity axis direction (Y direction) is set as T14, the distance T14 between the outer surfaces is larger than the length size L2 of the first soft magnetic body 18. That is, a region surrounded by the outermost surface of the first soft magnetic body 18 (a region surrounded by a dotted line) is formed so as to be elongated in the sensitivity axis direction (Y direction).

As also shown in FIG. 8, the magnetic flux density of the disturbance magnetic field from the element length direction (X direction) tends to be most intense in the vicinity of both sides in the element length direction (X direction) of the first soft magnetic bodies 18 located on both sides in the sensitivity axis direction (Y direction). That is, as in FIG. 15, the shield effect in an end region of the region surrounded by the outermost surface of the first soft magnetic body 18 (region surrounded by a dotted line) is weakened. As shown in FIG. 15, by forming the region surrounded by the outermost surface of the first soft magnetic body 18 (region surrounded by a dotted line) so as to be elongated in the sensitivity axis direction (Y direction), it is possible to reduce the influence of the region with the decrease in the shield effect on the element unit 12 as a whole.

Also, as in FIG. 16, by setting a width size W4 of a first soft magnetic body 27 (here, the reference symbol is changed to distinguish the first soft magnetic body 27 from the first soft magnetic body located on the inner side) located on both sides in the sensitivity axis direction (Y direction) larger than the width size W2 of the first soft magnetic body 18 located on the inner side as compared with the first soft magnetic body 27, it is possible to reduce the influence of the region with the decrease in the shield effect on the element unit 12 as a whole.

All of the first soft magnetic bodies 18 may not necessarily be arranged on the same position with respect to the respective element units 12. For example, the first soft magnetic body 18 is provided immediately above the element unit 12 located in the vicinity of the center, and for the element units 12 on the lateral sides, the first soft magnetic bodies 18 are provided on both lateral sides of the element unit 12. Also, it is not intended to exclude a mode in which the first soft magnetic bodies 18 are arranged on upper and lower sides of the respective element units 12, a mode in which in the first soft magnetic bodies 18 are arranged in the lateral and film thickness directions of the respective element units 12, and the like.

The number of the element units 12 constituting the magnetoresistive effect elements 2 and 3 and the fixed resistance elements 4 and 5 may be one each, but it is preferable to provide the plural element units 12 to form the meander shape so that the element resistance can be set large, and the consumed power can be reduced.

Also, the number of the magnetoresistive effect elements 2 and 3 and the fixed resistance elements 4 and 5 may be one each, but by constructing a bridge circuit shown in FIG. 19 and setting an output obtained from the output taking out unit 14 as a differential output in the differential amplifier 9, it is possible to increase the output value large, and the magnetic field detection at a high accuracy can be carried out.

It is also possible to change the fixed magnetization direction (P direction) of the fixed magnetic layer 34 within the same chip or adopt a full bridge configuration by using two chips having the same fixed magnetism direction (P direction).

Figure 21:
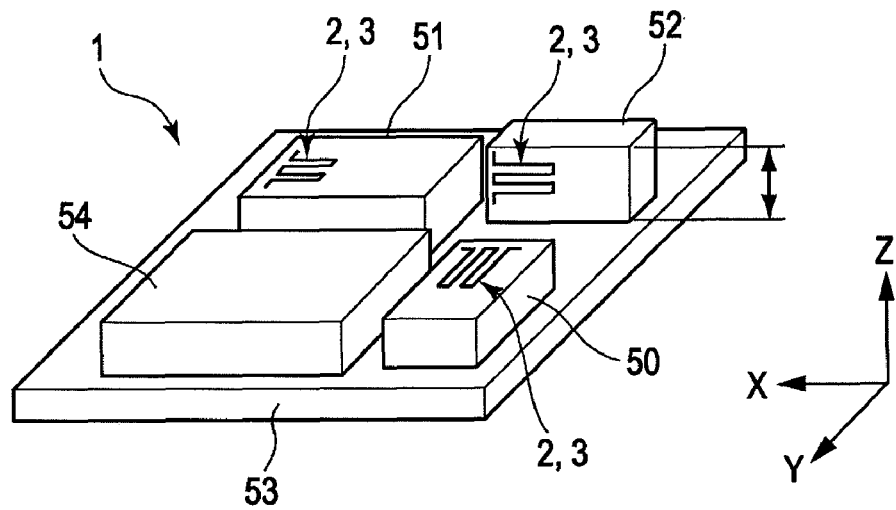
FIG. 21 is a partial perspective view of a geomagnetic sensor module according to the present embodiment.

The magnetic sensor 1 according to the present embodiment is used, for example, as the geomagnetic sensor (magnetic sensor module) shown in FIG. 21. In all of an X axis magnetic field detection unit 50, a Y axis magnetic field detection unit 51, and a Z axis magnetic field detection unit 52, a sensor unit having the bridge circuit shown in FIG. 19 is provided. In the X axis magnetic field detection unit 50, the fixed magnetization direction (P direction) of the fixed magnetic layer 34 for the element unit 12 of the magnetoresistive effect elements 2 and 3 faces the X direction which is the sensitivity axis. Also, in the Y axis magnetic field detection unit 51, the fixed magnetization direction (P direction) of the fixed magnetic layer 34 for the element unit 12 of the magnetoresistive effect elements 2 and 3 faces the Y direction which is the sensitivity axis. Furthermore, in the Z axis magnetic field detection unit 52, the fixed magnetization direction (P direction) of the fixed magnetic layer 34 for the element unit 12 of the magnetoresistive effect elements 2 and 3 faces the Z direction which is the sensitivity axis.

The X axis magnetic field detection unit 50, the Y axis magnetic field detection unit 51, the Z axis magnetic field detection unit 52, and an integrated circuit (ASIC) 54 are all provided on a base 53. Formation surfaces of the magnetoresistive effect elements 2 and 3 of the X axis magnetic field detection unit 50 and the Y axis magnetic field detection unit 51 are all X-Y plans, but a formation surface of the magnetoresistive effect elements 2 and 3 of the Z axis magnetic field detection unit 52 is an X-Z plan. The formation surface of the magnetoresistive effect elements 2 and 3 of the Z axis magnetic field detection unit 52 is in a relation perpendicular to the formation surfaces of the magnetoresistive effect elements 2 and 3 of the X axis magnetic field detection unit 50 and the Y axis magnetic field detection unit 51.

According to the present embodiment, the magnetic shield effect with respect to the direction perpendicular to the sensitivity axis direction is exercised, and also an appropriate sensitivity with respect to the sensitivity axis direction is provided. Therefore, even when two or more detection units of the X axis magnetic field detection unit 50, the Y axis magnetic field detection unit 51, and the Z axis magnetic field detection unit 52 are provided on the base 53, in the respective detection units, the magnetic field from the direction perpendicular to the sensitivity axis direction can be appropriately subjected to the magnetic shield, and also it is possible to appropriately detect the earth magnetism from the sensitivity axis direction of the respective detection units.

Other than the configuration of FIG. 21, it is also adopt a module in which the geomagnetic sensor shown in FIG. 21, an acceleration sensor, and the like are combined.

EXAMPLES

The magnetoresistive effect element shown in FIGS. 1A to 1C was formed. Six strips of the element units 12 ware formed to obtain the meander shape. The element width W1 of the element unit 12 was set as 5 µm, the element length L1 was set as 60 µm, the thickness T1 was set as 250 Å, the width size W2 of the first soft magnetic body (CoFeSiB) was set as 2 µm, the length size L2 was set as 100 µm, the thickness T2 was set as 5000 Å, the gap T5 between the first soft magnetic body 18 and the element unit 12 of the magnetoresistive effect element in the height direction was set as 0.3 □m, the distance T4 between the element unit 12 and the first soft magnetic body 18 in the Y direction was set as 1 µm, the length size T8 of the extension part 18a of the first soft magnetic body 18 was set as 10 µm, the gap T4 between the first soft magnetic body 18 and the adjacent element unit 12 was set as 2 µm, and the distance T3 between the first soft magnetic bodies 18 was set as 9 µm. Through the annealing in the magnetic field, the fixed magnetic layer 34 was subjected to the fixed magnetism in the element width direction (Y direction).

Figure 22:
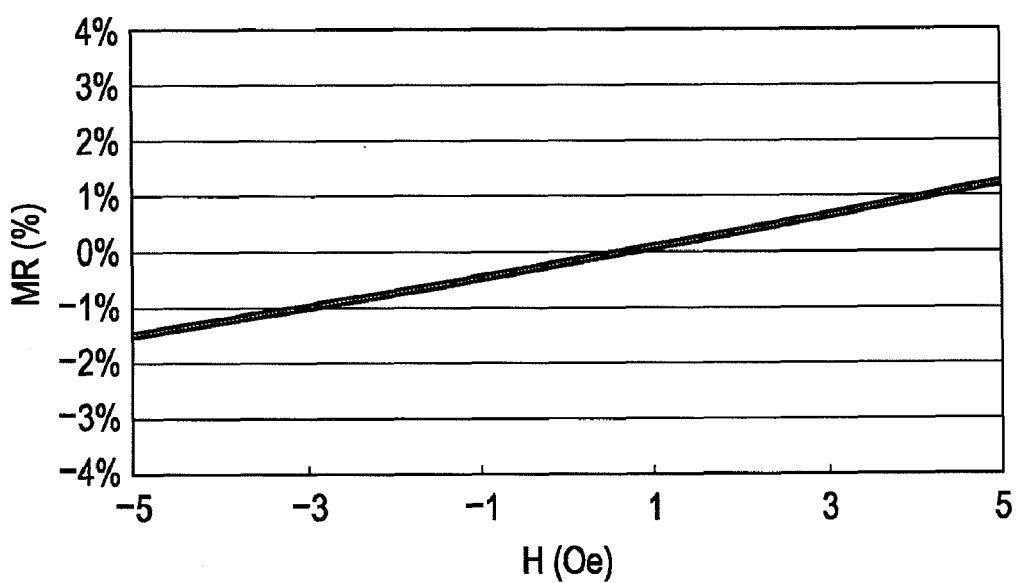
FIG. 22 is a graph representing respective measurement results of the resistance change rate (MR ratio) per unit magnetic field of the magnetoresistive effect element by using the magnetoresistive effect element shown in FIGS. 1A to 1C in a case where the external magnetic field was applied only within a range of ±6 Oe in the sensitivity axis direction, in a case where the external magnetic field within a range of □6 Oe was effected in the sensitivity axis direction while the external magnetic field at +5 Oe was applied in the element length direction perpendicular to the sensitivity axis, and in a case where the external magnetic field within a range of ±6 Oe was effected in the sensitivity axis direction while the external magnetic field at −5 Oe was applied in the element length direction perpendicular to the sensitivity axis.

FIG. 22 shows the resistance change rate per unit magnetic field (MR ratio) of the magnetoresistive effect elements 2 and 3 in which the external magnetic field was applied in a range of ±6 Oe in the sensitivity axis direction. Although overlapped in FIG. 22, in actuality, three types of experiments were conducted. The first experiment was a case where the external magnetic field was applied only within a range of ±6 Oe in the sensitivity axis direction, the second experiment was a case where the external magnetic field within a range of ±6 Oe was effected in the sensitivity axis direction while the external magnetic field at +5 Oe was applied in the element length direction perpendicular to the sensitivity axis, and the third experiment was a case where the external magnetic field within a range of ±6 Oe was effected in the sensitivity axis direction while the external magnetic field at −5 Oe was applied in the element length direction perpendicular to the sensitivity axis.

In either of the experiment results, the behaviors of the resistance change rate per unit magnetic field (MR ratio) with respect to the external magnetic field were in a straight manner and also were located on almost the same graph. For this reason, it was found out that the appropriate sensitivity with respect to the external magnetic field from the sensitivity axis direction could be maintained, and on the other hand, the external magnetic field in the direction perpendicular to the sensitivity axis was appropriately shielded.

Figure 23:
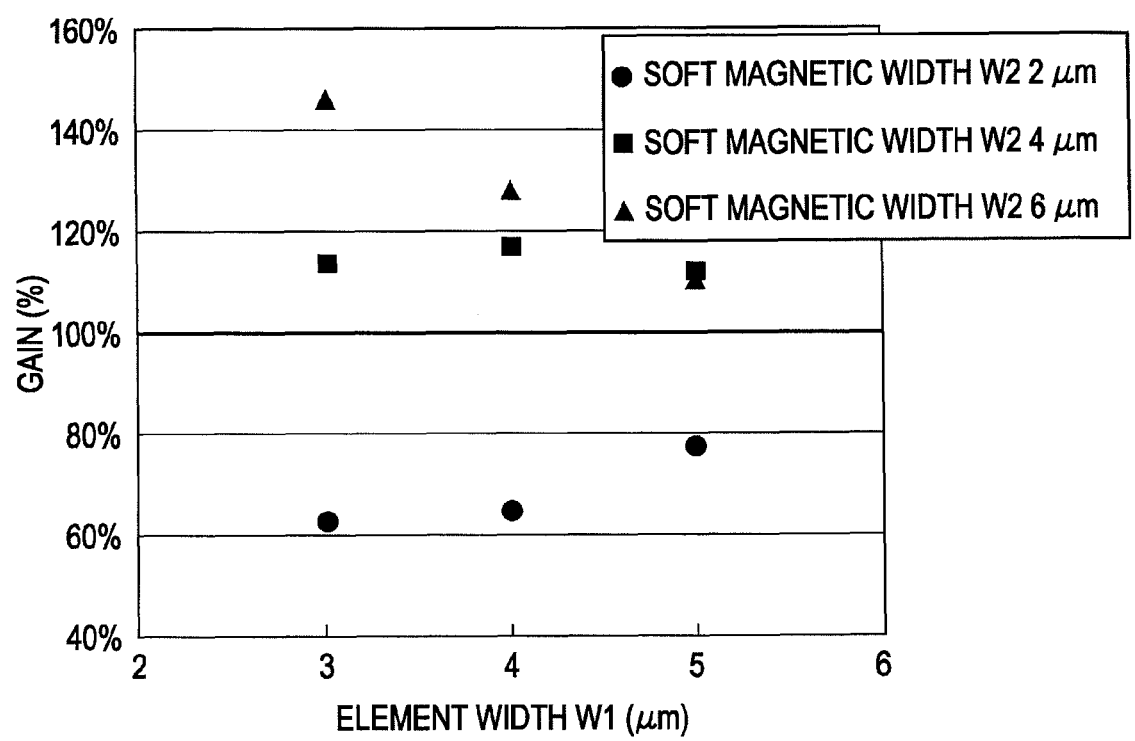
FIG. 23 is a graph representing a gain of the resistance change rate (MR ratio) per unit magnetic field of the magnetoresistive effect element with respect to the external magnet field from the sensitivity axis when an element width W1 of an element unit constituting the magnetoresistive effect element used in the experiment in FIG. 17 or a width size W2 of a first soft magnetic body is changed.

Next, by changing the element width W1 of the element units 12 constituting the magnetoresistive effect elements 2 and 3 used in the experiment of FIG. 22 or the width size W2 of the first soft magnetic body 18, the gain of the resistance change rate per unit magnetic field (MR ratio) with respect to the external magnetic field from the sensitivity axis direction was investigated (FIG. 23). It should be noted that other than the element width W1 and the width size W2, the same sizes were set as those used in the experiment of FIG. 17. The distance T4 between the element unit 12 and the first soft magnetic body 18 in the Y direction was set as 1 µm.

As shown in FIG. 23, the gain could be set to be equal to or smaller than 160%. Also, it was found out that by setting the width size W2 of the first soft magnetic body 18 smaller than the element width W1 of the element unit 12, it was easier to adjust the gain to be 100% or lower.

Next, the magnetoresistive effect elements 2 and 3 shown in FIGS. 2A and 2B were formed. Six strips of the element units 12 were formed to obtain the meander shape. The element width W1 of the element unit 12 was set as 5 µm, the element length L1 was set as 60 µm, the thickness T1 was set as 250 Å, the width size W2 of the first soft magnetic body (CoFeSiB) was set as 2 µm, the length size L2 was set as 80 µm, the thickness T2 was set as 5000 Å, the gap T7 between the first soft magnetic body 18 and the element unit 12 of the magnetoresistive effect element in the height direction was set as 0.3 µm, the length size T8 of the extension part 18a of the first soft magnetic body 18 was set as 10 µm, and the distance T6 between the first soft magnetic bodies 18 was set as 5 µm. Through the annealing in the magnetic field, the fixed magnetic layer 34 was subjected to the fixed magnetism in the element width direction (Y direction).

In the experiment, the resistance change rate per unit magnetic field (MR ratio) of the magnetoresistive effect elements 2 and 3 was investigated in each of a case where the magnetic field within a range of ±5 Oe was applied only in the sensitivity axis direction, a case where the magnetic field within a range of ±5 Oe was applied in the sensitivity axis direction while the external magnetic field at ±5 Oe was applied in the direction perpendicular to the sensitivity axis, a case where the magnetic field within a range of ±5 Oe was applied in the sensitivity axis direction while the external magnetic field at −5 Oe was applied in the element length direction perpendicular to the sensitivity axis, and a case where the magnetic field within a range of ±5 Oe was applied only in the direction perpendicular to the sensitivity axis. The experiment results are shown in FIG. 24.

Figure 24:
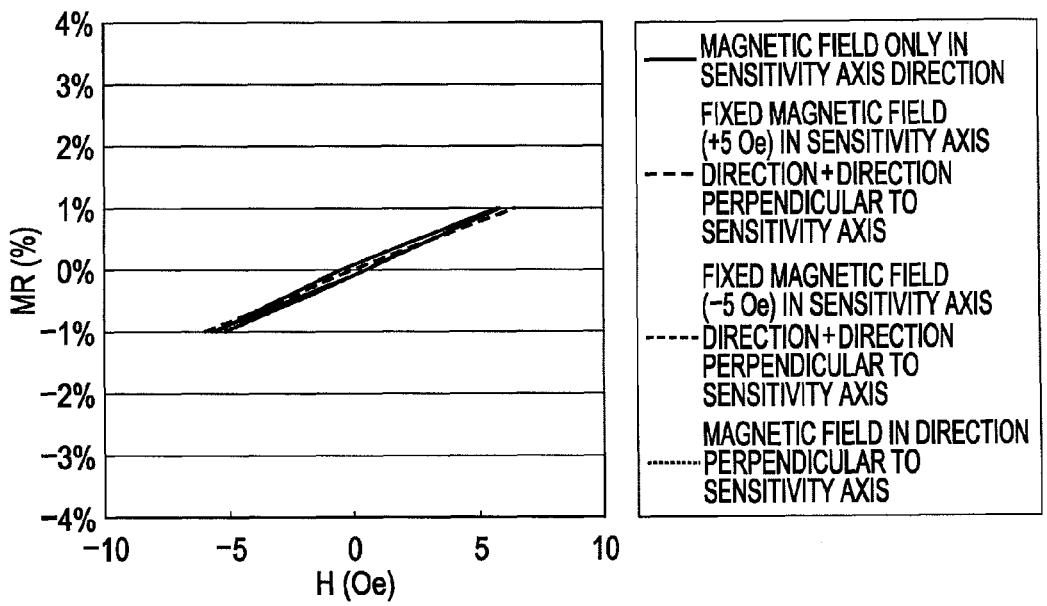
FIG. 24 is a graph representing respective measurement results of the resistance change rate (MR ratio) per unit magnetic field of the magnetoresistive effect element by using the magnetoresistive effect element shown in FIG. 2 in a case where the magnetic field within a range of ±5 Oe was applied only in the sensitivity axis direction, in a case where the magnetic field within a range of ±5 Oe was applied in the sensitivity axis direction while the external magnetic field at +5 Oe was applied in the element length direction perpendicular to the sensitivity axis, in a case where the magnetic field within a range of ±5 Oe was applied in the sensitivity axis direction while the external magnetic field at −5 Oe was applied in the element length direction perpendicular to the sensitivity axis, and in a case where the magnetic field within a range of +5 Oe was applied only in the direction perpendicular to the sensitivity axis.

As shown in FIG. 24, in the case where the magnetic field within a range of ±5 Oe was applied only in the sensitivity axis direction, the case where the magnetic field within a range of ±5 Oe was applied in the sensitivity axis direction while the external magnetic field at ±5 Oe was applied in the direction perpendicular to the sensitivity axis, and the case where the magnetic field within a range of ±5 Oe was applied in the sensitivity axis direction while the external magnetic field at −5 Oe was applied in the element length direction perpendicular to the sensitivity axis, the behaviors of the resistance change rate per unit magnetic field (MR ratio) with respect to the external magnetic field were almost matched one another. Also, in the case where the magnetic field within a range of ±5 Oe was applied only in the direction perpendicular to the sensitivity axis, the resistance change rate per unit magnetic field (MR ratio) was almost zero. It was found out that with this configuration, the external magnetic field affecting from the direction perpendicular to the sensitivity axis direction was appropriately shielded, and further, the appropriate sensitivity with respect to the external magnetic field from the sensitivity axis direction was provided.

Next, an experiment was conducted on the fixed resistance elements 4 and 5 connected in serial with the magnetoresistive effect elements 2 and 3 shown in FIGS. 6A and 6B and FIGS. 7A and 7B.

Six strips of the element units 12 constituting the fixed resistance elements 4 and 5 shown in FIGS. 6A and 6B were formed to obtain the meander shape. Also, the element width W1 of the element unit 12 was set as 3 µm, the element length L1 was set as 60 µm, the width size W3 of the second soft magnetic body 23 was set as 6 µm, the length size L3 was set as 100 µm, the distance T11 between the respective second soft magnetic bodies 23 was set as 2 µm, and the distance T13 between the element unit 12 and the second soft magnetic body 23 in the height direction (see FIG. 6B) was set as 0.3

μm. The fixed magnetic layer 34 of the respective element units 12 was subjected to the magnetism fixture to the element length direction (Y direction).

On the other hand, six strips of the element units 12 constituting the fixed resistance elements 4 and 5 shown in FIGS. 7A and 7B were formed to obtain the meander shape. Also, the element width W1 of the element unit 12 was set as 3 μm, the element length L1 was set as 60 μm, the width size W3 of the second soft magnetic body 23 was set as 6 μm, the length size L3 was set as 100 μm, the distance T11 between the respective second soft magnetic bodies 23 was set as 2 μm, and the distance T13 between the element unit 12 and the second soft magnetic body 23 in the height direction (see FIG. 7B) was set as 0.3 μm. The fixed magnetic layer 34 of the respective element units 12 was subjected to the magnetism fixture to the element width direction (Y direction).

In the experiment, before the second soft magnetic body 23 was formed, the external magnetic field was effected on the element unit 12 coupled to the meander shape in the Y direction and the X direction shown in FIGS. 6A and 6B and FIGS. 7A and 7B to investigate the resistance change rate per unit magnetic field (MR ratio) of the element unit 12. Then, next, in a state in which the second soft magnetic body 23 was provided, the external magnetic field was effected in the Y direction and the X direction to investigate the resistance change rate per unit magnetic field (MR ratio) of the element unit 12. The experiment results are shown in FIG. 25 and FIG. 26.

Figure 25:
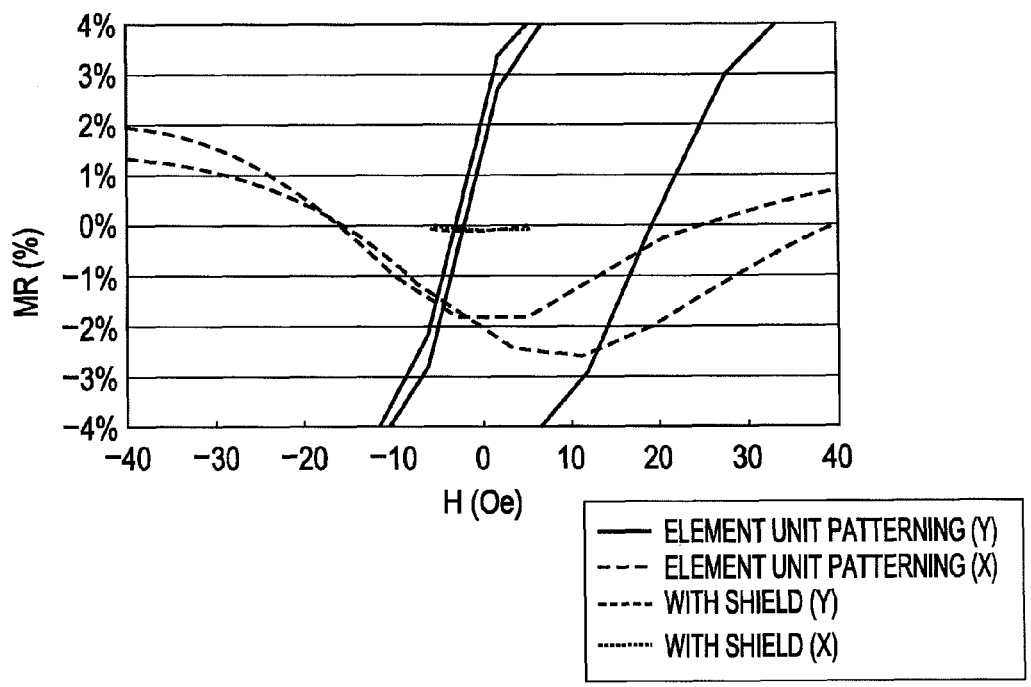
FIG. 25 is a graph representing respective measurement results of the resistance change rate (MR ratio) per unit magnetic field of the fixed resistance element when the external magnetic field is effected in the Y direction and the X direction by using the fixed resistance element shown in FIGS. 6A and 6B (in the experiment, both modes are used in which a second soft magnetic body is provided and in which the second soft magnetic body is not provided)
Figure 26:
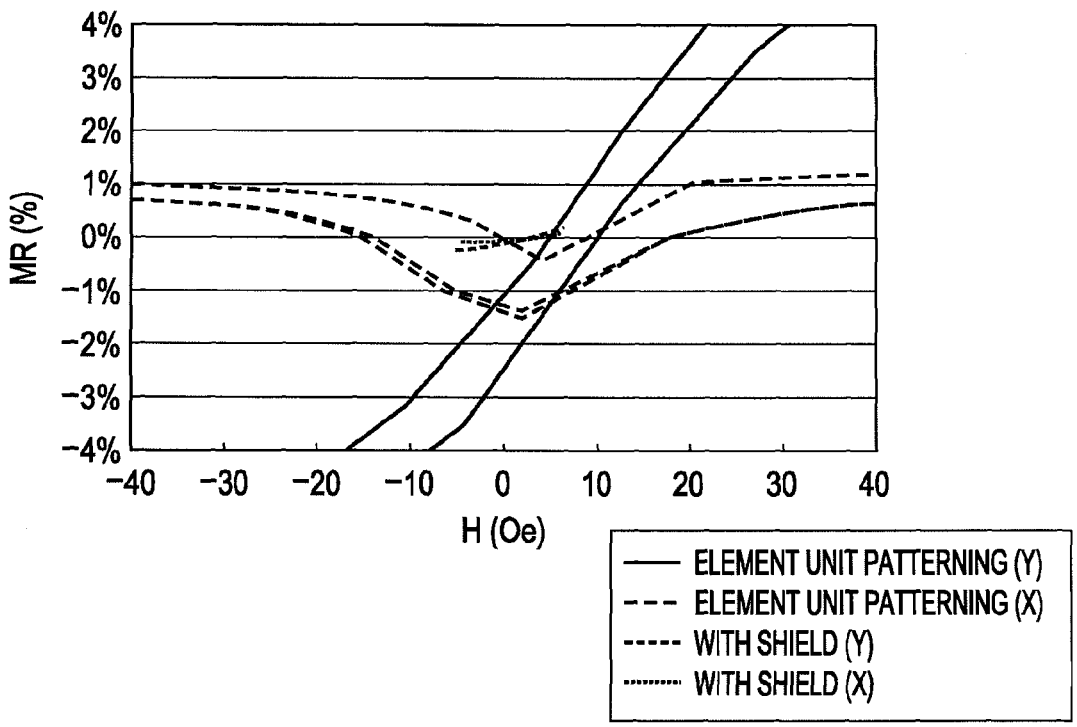
FIG. 26 is a graph representing respective measurement results of the resistance change rate (MR ratio) per unit magnetic field of the fixed resistance element when the external magnetic field is effected in the Y direction and the X direction by using the fixed resistance element shown in FIGS. 7A and 7B (in the experiment, both modes are used in which the second soft magnetic body is provided and in which the second soft magnetic body is not provided)

FIG. 25 shows an experiment result with respect to the fixed resistance elements 4 and 5 shown in FIGS. 6A and 6B, and FIG. 26 shows an experiment result with respect to the fixed resistance elements 4 and 5 shown in FIGS. 7A and 7B.

As shown in FIG. 25 and FIG. 26, by providing the second soft magnetic body 23, the shield effect was appropriately exercised, and even when the external magnetic field was effected in both the X direction and the Y direction, the resistance change rate per unit magnetic field (MR ratio) could be set as almost zero (%) (0.02%).

It should be however noted that it was found out that as compared with the mode of the fixed resistance elements 4 and 5 shown in FIGS. 7A and 7B which were used in the experiment of FIG. 26, the fixed resistance elements 4 and 5 shown in FIGS. 6A and 6B which were used in the experiment of FIG. 25 was preferable because the resistance change rate per unit magnetic field (MR ratio) could be set close to zero (%) more reliably in entire the range of several Oe where the external magnetic field was effected.

Figure 27:
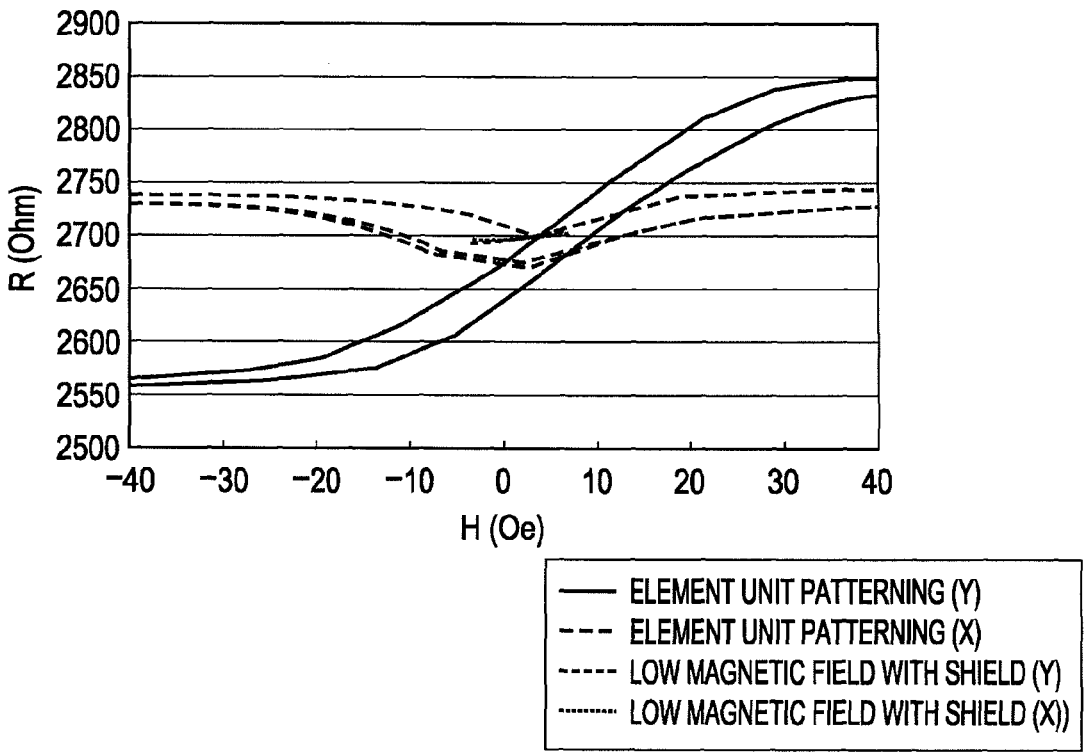
FIG. 27 is a graph representing respective measurement results of an electric resistance value of the fixed resistance element when the external magnetic field is effected in the Y direction and the X direction by using the fixed resistance element shown in FIGS. 7A and 7B (in the experiment, both modes are used in which the second soft magnetic body is provided and in which the second soft magnetic body is not provided).

FIG. 27 is a graph showing a relation between the external magnetic field where the experience was conducted by using the fixed resistance elements 4 and 5 shown in FIGS. 7A and 7B and the electric resistance value.

First, in the experiment, before the second soft magnetic body 23 was formed, the external magnetic field was effected on the element unit 12 coupled to the meander shape in the Y direction and the X direction shown in FIGS. 7A and 7B to investigate the electric resistance value of the element unit 12. Then, next, in a state in which the second soft magnetic body 23 was provided, the external magnetic field was effected in the Y direction and the X direction to investigate the electric resistance value of the element unit 12.

The fixed magnetism direction (P direction) of the fixed magnetic layer for the element unit 12 shown in FIGS. 7A and 7B faces the element width direction perpendicular to the element length direction which was the longitudinal direction, and the magnetism direction of the free magnetic layer faces the element length direction because of the shape anisotropy in a state in which the external magnetic field was not effected. By adopting such an element mode, a magnetic coercive force Hc of the element unit 12 could be set relatively small. For this reason, when the fixed resistance elements 4 and 5 were formed by providing the second soft magnetic body 23, it was easy to maintain the electric resistance values of the fixed resistance elements 4 and 5 with respect to a low magnetic field at about several Oe to constant values, and it was easy to suppress a midpoint potential deviation when the bridge circuit was formed with the magnetoresistive effect elements 2 and 3.

What is claimed is:

1. A magnetic sensor comprising:
   a magnetoresistive effect element including an element unit whose element length L1 is formed longer than an element width W1, the element unit including a fixed magnetic layer whose magnetism direction is fixed and a free magnetic layer whose magnetism direction fluctuates upon reception of an external magnetic field, the free magnetic layer being laminated on the fixed magnetic layer via a non-magnetic layer, and the fixed magnetism direction of the fixed magnetic layer facing an element width direction which is a sensitivity axis direction; and
   a first soft magnetic body arranged in a non-contact manner with the magnetoresistive effect element, the first soft magnetic body being formed to have a width size in a same direction as the element width W1 set as W2 and a length size in a same direction as the element length L1 set as L2, the length size L2 of the first soft magnetic body being longer than the element length L1, and the first soft magnetic body including an extension part extending from both sides of the element length direction of the element unit in the element length direction.

2. The magnetic sensor according to claim 1, wherein the width size W2 of the first soft magnetic body is smaller than the element width W1 of the element unit.

3. The magnetic sensor according to claim 1, wherein the width size W2 of the first soft magnetic body is equal to or larger than the element width W1 of the element unit.

4. The magnetic sensor according to claim 1, wherein the first soft magnetic bodies are arranged on both sides in the element width direction of the element unit.

5. The magnetic sensor according to claim 1, wherein the first soft magnetic bodies are arranged in a thickness direction of the element unit.

6. The magnetic sensor according to claim 1,
   wherein a plurality of the element units are arranged with a gap in the element width direction, and ends of the element units are connected to form a meander shape, and
   wherein the first soft magnetic body is arranged at a position immediately above the element unit, a position immediately below the element unit, or at least one of positions on both sides of the element unit for each of the element units.

7. The magnetic sensor according to claim 6, wherein a length size of the extending unit of the first soft magnetic body/a distance between the respective first soft magnetic bodies is equal to or larger than 3.

8. The magnetic sensor according to claim 6, wherein a gap between the respective first soft magnetic bodies is larger than the width size W2 of the first soft magnetic body.

9. The magnetic sensor according to claim 6, wherein the first soft magnetic bodies are further arranged at least one each on an outer side of both lateral surfaces of the element units located on both sides in the element width direction.

10. The magnetic sensor according to claim 1, further comprising:

the magnetoresistive effect element and a fixed resistance element connected in series with the magnetoresistive effect element via an output taking out unit, the fixed resistance element including an element unit having an elongated shape in which an element length is formed to be longer than an element width, the element unit constituting the fixed magnetic layer including the fixed magnetic layer and the free magnetic layer laminated on the fixed magnetic layer via the non-magnetic layer;

an extension part having a gap with respect to the element unit constituting the fixed resistance element and extending in the element width direction from both sides of the element width of the element unit in which a width size W3 in a same direction as the element width is larger than the element width;

an extension part extending in the element length direction from both sides in the element length direction of the element unit in which a length size L3 in a same direction as the element length is larger than the element length; and a second soft magnetic body arranged in a laminated manner in which the length size L3 is larger than the width size W3.

11. The magnetic sensor according to claim 10, wherein a plurality of the element units constituting the fixed resistance element are arranged with a gap in the element width direction, and the ends of the respective element units are connected to form a meander shape, and wherein the second soft magnetic body is individually arranged with respect to the respective element units constituting the fixed resistance element.

12. The magnetic sensor according to claim 11, wherein the second soft magnetic bodies are further arranged on an outer side of both lateral surfaces of the element units located on both sides in the element width direction.

13. The magnetic sensor according to claim 10, wherein the element unit constituting the magnetoresistive effect element and the element unit constituting the fixed resistance element are formed in a same film structure and in a same creation process.

14. The magnetic sensor according to claim 10, wherein the first soft magnetic body and the second soft magnetic body are formed in a same film structure and in a same creation process.

15. The magnetic sensor according to claim 1, wherein a linear region of a resistance change in the magnetoresistive effect element is larger than an integration of a disturbance magnetic field flowing from the element width direction and a sensed magnetic field.

16. The magnetic sensor according to claim 1, wherein an anisotropy magnetic field Hk in the magnetoresistive effect element is equal to or larger than 20 Oe.

17. The magnetic sensor according to claim 1, wherein the width size W2 of the first soft magnetic body is regulated so that a gain of a magnetic field intensity affecting the element unit is equal to or larger than 50% and equal to or smaller than 200% when the external magnetic field flows in from the element width direction.

18. The magnetic sensor according to claim 1, wherein the width size W2 of the first soft magnetic body is regulated so that a gain of a resistance change rate per unit magnetic field of the magnetoresistive effect element is equal to or larger than 50% and equal to or smaller than 200% when the external magnetic field flows in from the element width direction.

19. A magnetic sensor module comprising a plurality of the magnetic sensors according to claim 1, wherein the respective magnetoresistive effect elements are arranged so that the sensitivity axes of at least one set of the magnetoresistive effect elements of the plurality of the magnetic sensors are perpendicular to each other.

* * * * *